US007199602B2

(12) United States Patent
Nara et al.

(10) Patent No.: US 7,199,602 B2
(45) Date of Patent: Apr. 3, 2007

(54) INSPECTION METHOD AND INSPECTION DEVICE FOR DISPLAY DEVICE AND ACTIVE MATRIX SUBSTRATE USED FOR DISPLAY DEVICE

(75) Inventors: Shoji Nara, Yokohama (JP); Masatoshi Itoh, Fujisawa (JP); Makoto Ookuma, Yokohama (JP); Wataru Yamamoto, Yokohama (JP)

(73) Assignee: Wintest Corporation (JP)

( * ) Notice: Subject to any disclaimer, the term of this patent is extended or adjusted under 35 U.S.C. 154(b) by 34 days.

(21) Appl. No.: 10/944,682

(22) Filed: Sep. 17, 2004

(65) Prior Publication Data

US 2005/0093567 A1 May 5, 2005

(30) Foreign Application Priority Data

Sep. 19, 2003 (JP) ............................ 2003-328231
Jul. 28, 2004 (JP) ............................ 2004-220201

(51) Int. Cl.
*G01R 31/00* (2006.01)

(52) U.S. Cl. ..................................................... 324/770

(58) Field of Classification Search ................. 324/770
See application file for complete search history.

(56) References Cited

U.S. PATENT DOCUMENTS 5,377,030 A * 12/1994 Suzuki et al. ............... 349/187
6,815,975 B2 * 11/2004 Nara et al. .................. 324/770
2003/0011314 A1 * 1/2003 Numao .................... 315/169.3
2003/0189535 A1 10/2003 Matsumoto
2004/0217773 A1 * 11/2004 Nara et al. .................. 324/770

FOREIGN PATENT DOCUMENTS

| | | |
|---|---|---|
| JP | 10-321367 | 12/1998 |
| JP | 2000-348861 | 12/2000 |
| JP | 2002-032035 | 1/2002 |
| JP | 2002-040082 | 2/2002 |
| JP | 2002-297053 | 10/2002 |
| JP | 2003-173154 | 6/2003 |
| JP | 2004-191603 | 7/2004 |

* cited by examiner

*Primary Examiner*—Ha Tran Nguyen
*Assistant Examiner*—Roberto Velez
(74) *Attorney, Agent, or Firm*—Harness, Dickey & Pierce, P.L.C.

(57) ABSTRACT

An inspection device for a display device includes: an inspection circuit which judges a defect of each of pixels based on current which flows through an inspection interconnect connected with interconnects of the display device; and an inspection driver circuit which drives by supplying a necessary signal to the display device. The inspection circuit includes: a correction circuit which generates a first correction current which substantially cancels a first current which flows through the inspection interconnect when all the pixels are set to an off-state based on the first current; a detection circuit which detects a measured value for each pixel obtained by correcting a measured current which flows through the inspection interconnect by the first correction current each time the pixels are sequentially set to an on-state; and a defect judgment circuit which judges a defect of each of the pixels based on the measured value.

20 Claims, 18 Drawing Sheets

INSPECTION METHOD AND INSPECTION DEVICE FOR DISPLAY DEVICE AND ACTIVE MATRIX SUBSTRATE USED FOR DISPLAY DEVICE

Japanese Patent Application No. 2003-328231, filed on Sep. 19, 2003, and No. 2004-220201, filed on Jul. 28, 2004 are hereby incorporated by reference in their entireties.

BACKGROUND OF THE INVENTION

The present invention relates to an inspection method and an inspection device used for inspecting a display device such as an organic EL display device and an active matrix substrate used for the display device.

As inspection methods for an organic EL display device, Japanese Patent Application Laid-open No. 10-321367 and Japanese Patent Application Laid-open No. 2000-348861 have been known as inspection methods for a passive matrix type organic EL display device, and Japanese Patent Application Laid-open No. 2002-32035, Japanese Patent Application Laid-open No. 2002-40082, and Japanese Patent Application Laid-open No. 2002-297053 have been known as inspection methods for an active matrix type organic EL display device.

When performing this type of inspection for a display device, each pixel is turned on and a pixel defect is judged based on current which flows thorough the inspection target pixel. In the display device, it is impossible to detect only current which flows through one pixel. This is because the interconnect is used in common by other pixels since a matrix interconnect is used.

BRIEF SUMMARY OF THE INVENTION

A first aspect of the present invention relates to an inspection method for a display device in which are formed a plurality of pixels arranged at least along one direction and interconnects for causing the pixels to be turned on and off, the inspection method comprising:

generating a first correction current which substantially cancels a first current which flows through an inspection interconnect connected with one of the interconnects when all the pixels are set to an off-state;

inspecting the pixels by sequentially causing the pixels to be turned on; and judging a defect of each of the pixels based on a measured value obtained by correcting a measured current which flows through the inspection interconnect by the first correction current each time the pixels are sequentially turned on.

A second aspect of the present invention relates to an inspection device for a display device in which are formed a plurality of pixels arranged at least along one direction and interconnects for causing the pixels to be turned on and off, the inspection device comprising:

an inspection circuit which judges a defect of each of the pixels based on current which flows through an inspection interconnect connected with one of the interconnects; and an inspection driver circuit which drives the display device by supplying a signal necessary for inspection to the display device, wherein the inspection circuit includes:

a correction circuit which generates a first correction current which substantially cancels a first current which flows through the inspection interconnect when all the pixels are set to an off-state based on the first current;

a detection circuit which detects a measured value obtained by correcting a measured current which flows through the inspection interconnect by the first correction current each time the pixels are sequentially set to an on-state; and a defect judgment circuit which judges a defect of each of the pixels based on the measured value.

A third aspect of the present invention relates to an inspection method for an active matrix substrate, comprising:

providing an active matrix substrate which includes a plurality of pixels, each of the pixels being connected with one of a plurality of signal lines, one of a plurality of scan lines, and one of a plurality of voltage supply lines, each of the pixels including a pixel select transistor connected with one of the signal lines and one of the scan lines, an operating transistor, and a storage capacitor for holding a gate potential of the operating transistor, a gate of the operating transistor being connected with the storage capacitor and the pixel select transistor, one of a source and a drain of the operating transistor being connected with one of the voltage supply lines, and the other of the source and the drain of the operating transistor being connected with an inspection interconnect;

generating a first correction current which substantially cancels a first current which flows through the inspection interconnect when the operating transistor of each of the pixels is set to an off-state;

inspecting the operating transistor by sequentially causing the operating transistor of each of the pixels to be turned on; and judging a defect of the operating transistor of each of the pixels based on a measured value obtained by correcting a measured current which flows through the inspection interconnect by the first correction current each time the operating transistor of each of the pixels is sequentially turned on.

A fourth aspect of the present invention relates to an inspection device for inspecting an active matrix substrate which includes a plurality of pixels, each of the pixels being connected with one of a plurality of signal lines, one of a plurality of scan lines, and one of a plurality of voltage supply lines, each of the pixels including a pixel select transistor connected with one of the signal lines and one of the scan lines, an operating transistor, and a storage capacitor for holding a gate potential of the operating transistor, a gate of the operating transistor being connected with the storage capacitor and the pixel select transistor, one of a source and a drain of the operating transistor being connected with one of the voltage supply lines, and the other of the source and the drain of the operating transistor being connected with an inspection interconnect, the inspection device comprising:

an inspection circuit which judges a defect of each of the pixels based on current which flows through the inspection interconnect; and an inspection driver circuit which drives the active matrix substrate by supplying a signal necessary for inspection to the active matrix substrate;

wherein the inspection circuit includes:

a correction circuit which generates a first correction current which substantially cancels a first current which flows through the inspection interconnect based on the first current when the operating transistor of each of the pixels is set to an off-state;

a detection circuit which detects a measured value obtained by correcting a measured current which flows through the inspection interconnect by the first correction current each time the operating transistor of each of the pixels is sequentially set to an on-state; and a defect judgment circuit which judges a defect of the operating transistor of each of the pixels based on the measured value.

DETAILED DESCRIPTION OF THE EMBODIMENT

Figure 1:
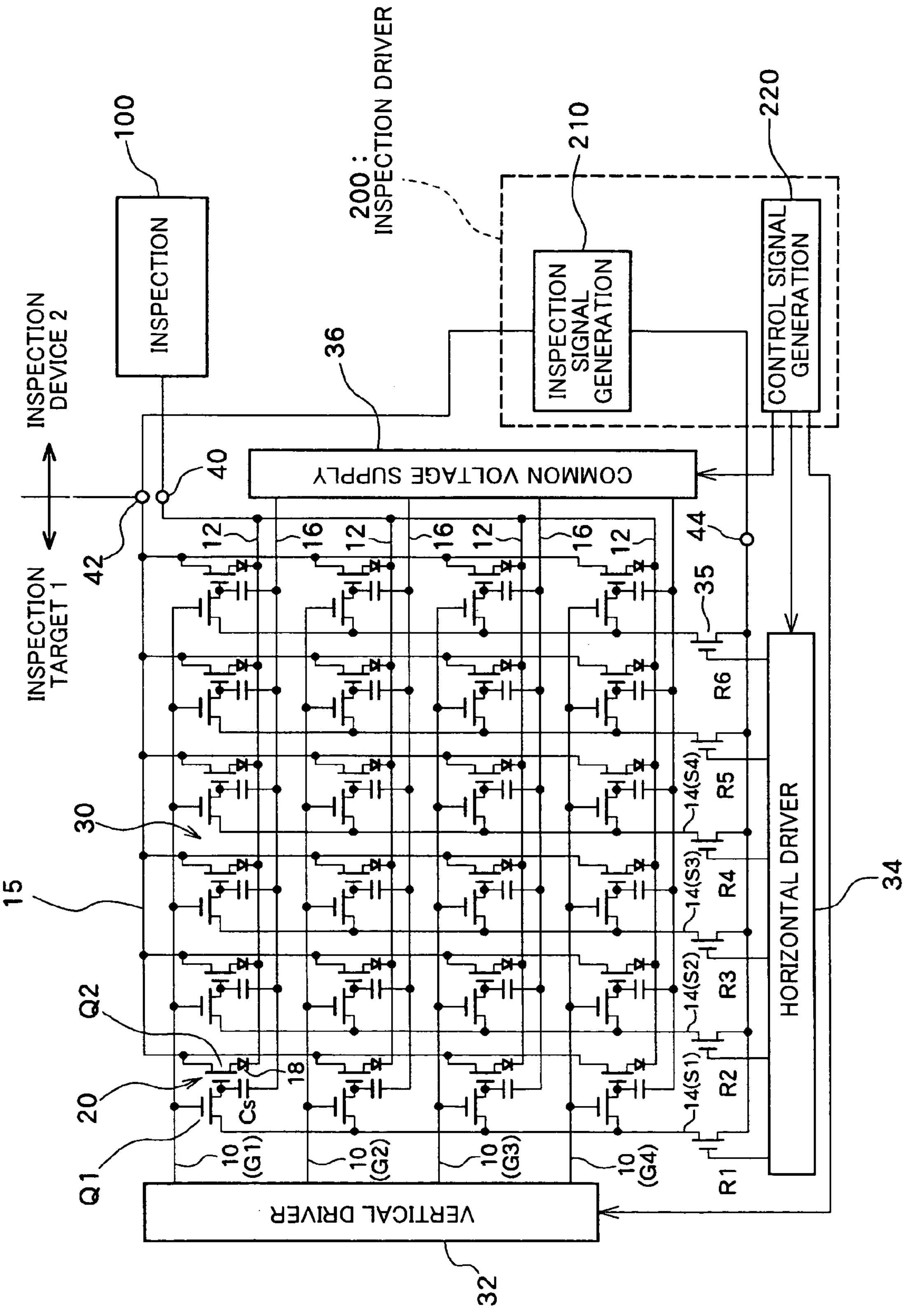
FIG. 1 shows an inspection device and an inspection target (active matrix type organic EL display device) of a first embodiment of the present invention.

Embodiments of the present invention can provide an inspection method and an inspection device for a display device and an active matrix substrate used for the display device, which enables pixel defect inspection based on current which flows through only one pixel to achieve highly accurate inspection by increasing the resolution of an inspection waveform.

One embodiment of the present invention provides an inspection method for a display device in which are formed a plurality of pixels and interconnects for causing the pixels to be turned on and off, the inspection method comprising:

generating a first correction current which substantially cancels a first current which flows through an inspection interconnect connected with one of the interconnects when all the pixels are set to an off-state;

inspecting the pixels by sequentially causing the pixels to be turned on; and judging a defect of each of the pixels based on a measured value obtained by correcting a measured current which flows through the inspection interconnect by the first correction current each time the pixels are sequentially turned on.

The first current corresponds to a leakage current, steady-state current, or the like which flows when all the pixels are turned off. According to the method of this embodiment, the leakage current, steady-state current, or the like can be canceled at the time of inspection. Therefore, when inspecting the pixels by causing each pixel to be turned on, current which is changed by causing the pixel to be turned on can be detected. In particular, even if current supplied to each pixel of the display device is set at 1 μA or less, the current which flows through the entire device reaches 100 times the current supplied to each pixel if a short-circuited defective pixel exists. Since the leakage current or the like is canceled by the method of this embodiment, a wide dynamic range is not necessary for a conversion circuit in the subsequent stage. Therefore, the resolution is increased to the extent that the range of the measured value becomes narrow, whereby inspection accuracy can be increased.

With this inspection method, in the inspection step, an inspection target pixel, which is one of the pixels, may be set to an on-state, and the inspection target pixel may be set to the off-state before setting another pixel to be subsequently inspected among the pixels to the on-state. In this case, in the defect judgment step, a defect of each of the pixels may be judged based on a difference between the measured value in the on-state and the measured value in the off-state.

Instead of the above feature, in the inspection step, one of the pixels may be set to the on-state, and another pixel to be subsequently inspected among the pixels may be set to the on-state while maintaining the on-state of the one of the pixels.

When the display device has the pixels formed along a plurality of lines, the inspection step may further include: measuring a second current which flows through the inspection interconnect each time the inspection step is completed for the pixels for one line of the display device; and generating a second correction current, which substantially cancels the second current, instead of the first correction current. The dynamic range of the conversion circuit in the subsequent stage can be made narrow by updating the second correction current each time the inspection step is completed for the pixels for one line of the display device.

This inspection step may further include: measuring a second current which flows through the inspection interconnect each time the inspection step is completed for one of the pixels; and generating a second correction current, which substantially cancels the second current, instead of the first correction current. Thus, the dynamic range of the conversion circuit in the subsequent stage can be made narrow by updating the second correction current each time the inspection step is completed for the one of the pixels.

Another embodiment of the present invention provides an inspection device for a display device in which are formed a plurality of pixels and interconnects for causing the pixels to be turned on and off, the inspection device comprising:

an inspection circuit which judges a defect of each of the pixels based on current which flows through an inspection interconnect connected with one of the interconnects; and an inspection driver circuit which drives the display device by supplying a signal necessary for inspection to the display device, wherein the inspection circuit includes:

a correction circuit which generates a first correction current which substantially cancels a first current which flows through the inspection interconnect when all the pixels are set to an off-state based on the first current;

a detection circuit which detects a measured value obtained by correcting a measured current which flows through the inspection interconnect by the first correction current each time the pixels are sequentially set to an on-state; and a defect judgment circuit which judges a defect of each of the pixels based on the measured value.

This inspection device can suitably implement the above-described inspection method.

The correction circuit of this inspection device may include:

a current measurement circuit which measures the first current in an upstream region of the inspection interconnect; and a correction current generation circuit which generates the first correction current which substantially cancels the first current and supplies the first correction current to a downstream region of the inspection interconnect.

This detection circuit may include a current-voltage conversion circuit which converts current which flows through the inspection interconnect into voltage. In this case, the correction circuit may include a correction current generation circuit which generates the first correction current based on output from the current-voltage conversion circuit and supplies the first correction current to the inspection interconnect. This correction circuit may include: a voltmeter which measures output from the current-voltage conversion circuit; and a correction current generation circuit which generates the first correction current based on output from the voltmeter and supplies the first correction current to a downstream region of the inspection interconnect.

Only a DC component based on the first current may be measured by providing a lowpass filter in the preceding stage of the voltmeter.

The inspection target may be either active type or passive type. An organic EL element can be given as the display element used for the pixel. However, other display elements may be used.

This inspection device may be applied to an active matrix substrate used for the above-described display device as the inspection target. The active matrix substrate includes a plurality of pixels, each of the pixels being connected with one of a plurality of signal lines, one of a plurality of scan lines, and one of a plurality of voltage supply lines, each of the pixels including a pixel select transistor connected with one of the signal lines and one of the scan lines, an operating transistor, and a storage capacitor for holding a gate potential of the operating transistor, a gate of the operating transistor being connected with the storage capacitor and the pixel select transistor, one of a source and a drain of the operating transistor being connected with one of the voltage supply lines, and the other of the source and the drain of the operating transistor being connected with an inspection interconnect, and the other of the source and the drain of the operating transistor being an open terminal. A display element is connected with the open terminal in the finished product. The inspection interconnect is connected in common with the open terminals of the operating transistors of the active matrix substrate preferably through a reset circuit.

In order to inspect the active matrix substrate in a state before being incorporated into a display device, the operating transistor is turned on and off in the active matrix substrate instead of causing the display element to be turned on and off in the display device. This enables a defect of the operating transistor to be judged in the same manner as in the method of judging a defect of the pixel of the display device.

Embodiments in which the present invention is applied to an organic EL device are described below. However, the display element is not limited to the organic EL element.

First Embodiment

Active Matrix Type Organic EL Display Device

A first embodiment of the present invention is described below with reference to the drawings.

FIG. 1 shows an active matrix type organic EL display device 1 which is an example of an inspection target, and an inspection device 2. The display device 1 is described below. In FIG. 1, a plurality of gate lines (scan lines) 10 (G1, G2, . . . ) are provided on one insulating substrate (active matrix substrate) along the row direction. A plurality of signal lines (source lines) 14 (S1, S2, . . . ) are provided on the insulating substrate along the column direction. A plurality of common lines 16 are provided on the insulating substrate along the row direction, for example. A plurality of common substrate common lines 12 are provided on the other insulating substrate along the row direction, for example. The common substrate common lines 12 are connected in common with a first terminal 40. An organic EL element 18 is disposed between the two insulating substrates. One end of the organic EL element 18 is connected with a drain side transparent electrode (not shown) of an operating transistor Q2 formed on the active matrix substrate, and the other end of the organic EL element 18 is connected with the common substrate common line 12 formed on the other insulating substrate.

A plurality of pixels 20 are arranged in a pixel matrix array region 30 in the shape of a matrix array. Each of the pixels 20 includes a pixel select transistor Q1, a storage capacitor Cs, the operating transistor Q2, and the organic EL element 18. A gate of the pixel select transistor Q1 is connected with the gate line 10, a source of the pixel select transistor Q1 is connected with the source line 14, and a drain of the pixel select transistor Q1 is connected with a gate of the operating transistor Q2 and one end of the storage capacitor Cs. The other end of the storage capacitor Cs is connected with the common line 16. A drain of the operating transistor Q2 is connected with one end of the organic EL element 18. The other end of the organic EL element 18 is connected with the common substrate common line 12. A source of the operating transistor Q2 of each pixel 20 is connected in common with a second terminal 42 through an anode line 15.

The gate lines 10 of the pixel matrix array 30 are connected with a vertical driver circuit 32, the source lines 14 are connected with a horizontal driver circuit 34 through a plurality of column select gates 35, and the common lines 16 are connected with a common voltage supply circuit 36. The vertical driver circuit 32, the horizontal driver circuit 34, and the common voltage supply circuit 36 may be formed on the active matrix substrate. In this case, the circuits 32, 34, and 36 are unnecessary for the inspection device, and the circuits 32, 34, and 36 formed on the active matrix substrate may be directly used. A source of the column select gate (transistor) 35 is connected in common with a third terminal 44.

Outline of Inspection Device

An inspection circuit 100 and an inspection driver circuit 200 are provided in the inspection device 2 shown in FIG. 1. The inspection driver circuit 200 drives the active matrix type organic EL display device 1 by supplying a signal necessary for inspection, and includes an inspection signal generation circuit 210 and a control signal generation circuit 220. The inspection circuit 100 is connected with the first terminal 40, and judges a defect of each pixel 20 based on current which flows through an inspection interconnect in the inspection circuit 100 through the common substrate common line 12 and the first terminal 40 at the time of inspection. The inspection signal generation circuit 210 supplies a drive voltage necessary for inspection to the vertical and horizontal driver circuits 32 and 34 and the common voltage supply circuit 36. The inspection signal generation circuit 210 is connected with the second and third terminals 42 and 44. The inspection signal generation circuit 210 supplies current which causes the organic EL element 18 to be in the on-state to the source of the operating transistor Q2 of each pixel 20 through the second terminal 42 at the time of inspection. The inspection signal generation circuit 210 supplies voltage for charging or discharging the storage capacitor Cs through the third terminal 44 at the time of inspection.

An example of an operation for causing each pixel 20 to be turned on and off at the time of inspection is described below with reference to FIG. 3.

Figure 3:
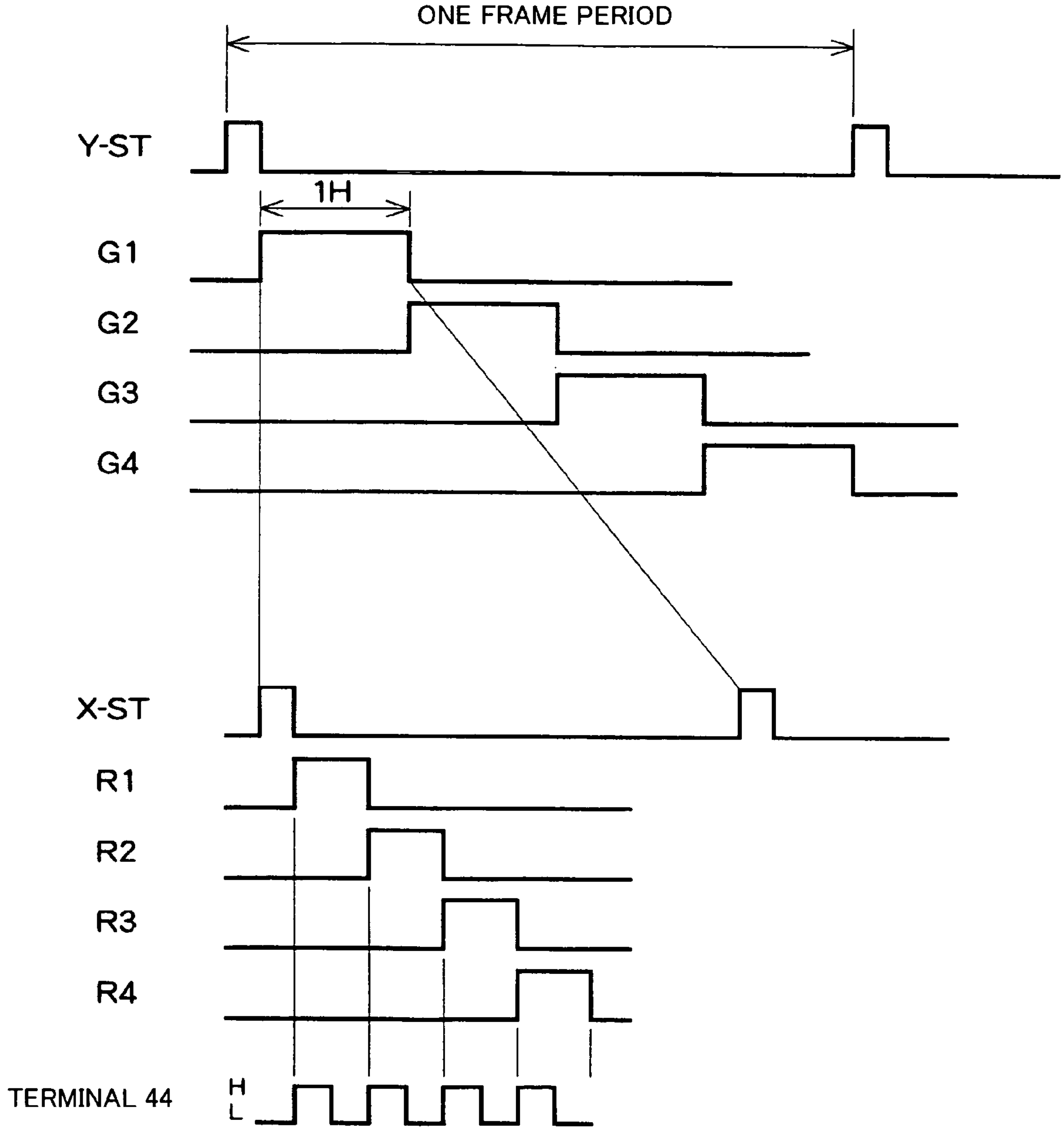
FIG. 3 shows a drive waveform of an inspection target realized by a signal from an inspection driver circuit shown in FIG. 1.

As shown in FIG. 3, a scan signal which is turned on only in one horizontal scanning period (1H) is supplied to the gate lines G1, G2, . . . from the vertical driver circuit 32 based on a control signal such as a Y start signal Y-ST (vertical synchronization signal) output from the control signal generation circuit 220. This causes the pixel select transistors Q1 in the first row to be turned on at the same time. Subsequently, the pixel select transistors Q1 in the second row to the fourth row are sequentially selected in row units.

A horizontal scan signal shown in FIG. 3 is supplied to column select gate control lines R1, R2, . . . from the horizontal driver circuit 34 based on a control signal such as an X start signal X-ST output from the control signal generation circuit 220. This causes the column select gates 35 to be sequentially turned on from the left each time the row is selected, whereby the source lines S1, S2, . . . are sequentially connected with the inspection signal generation circuit 210 from the left through the third terminal 44. The potentials supplied to each source line from the inspection signal generation circuit 210 through the third terminal 44 are a charging potential H which charges the storage capacitor Cs of each pixel 20 through the pixel select transistor Q1 and a discharging potential L which discharges the storage capacitor Cs of each pixel 20 through the pixel select transistor Q1.

When the storage capacitor Cs of the pixel 20 is charged, the operating transistor Q2 is turned on. This causes the current supplied from the second terminal 42 to flow through the organic EL element 18, whereby the pixel 20 is turned on. When the storage capacitor Cs of the pixel 20 is discharged, the operating transistor Q2 is turned off, whereby the pixel 20 is turned off. Therefore, each pixel 20 is point-sequentially scanned while being turned on or off.

Inspection Circuit

Figure 2:
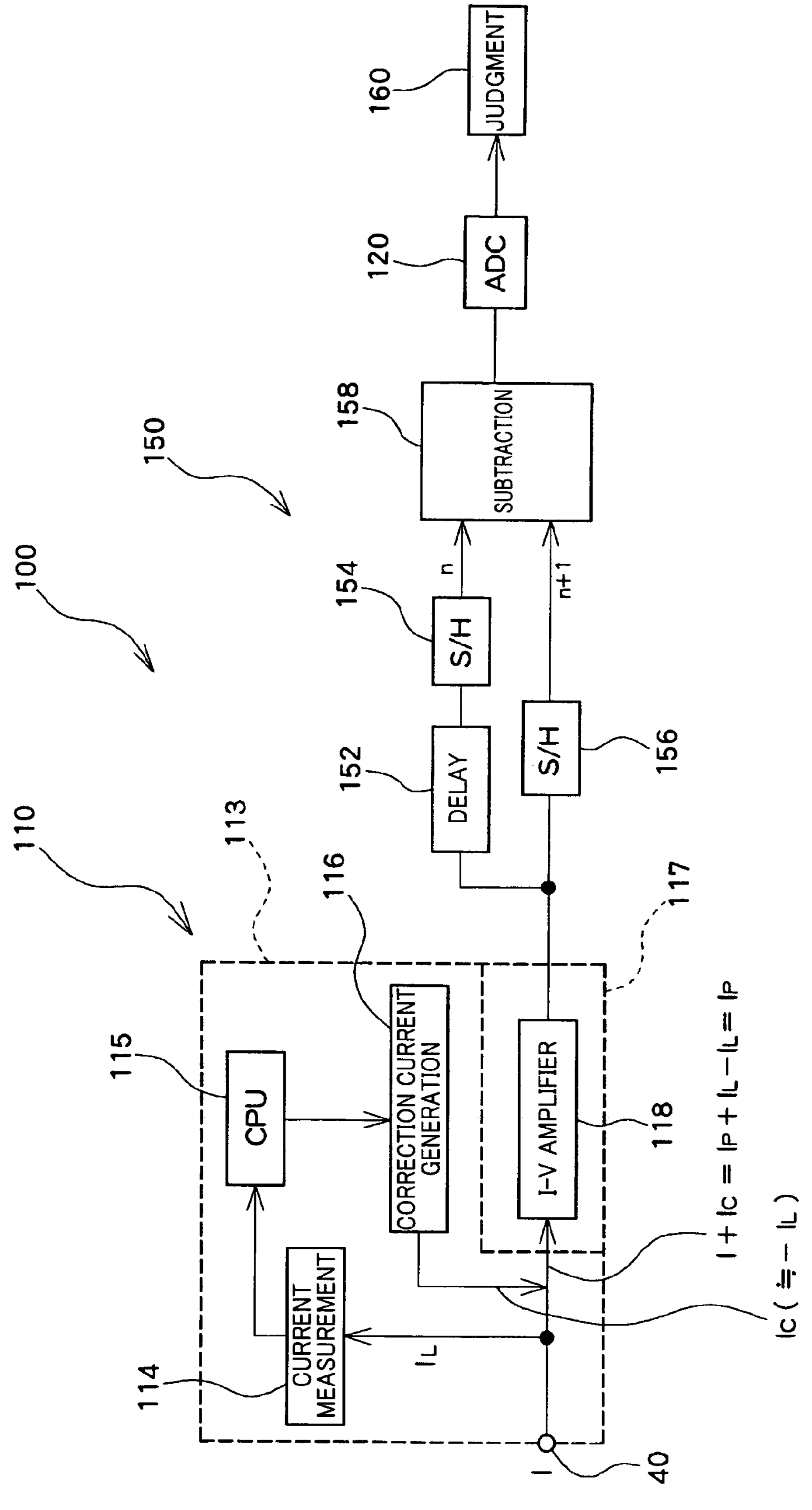
FIG. 2 is a block diagram showing an example of an inspection circuit shown in FIG. 1.

FIG. 2 is a block diagram showing an example of the inspection circuit 100 shown in FIG. 1. In FIG. 2, the inspection circuit 100 includes a pixel current detection circuit 110 and a defect judgment circuit 150.

The pixel current detection circuit 110 includes a correction circuit 113 and a detection circuit 117. The correction circuit 113 includes a current measurement circuit 114, a central processing unit (CPU) 115, and a correction current generation circuit 116, and the detection circuit 117 is formed by a current-voltage conversion (I–V) amplifier 118, for example.

The current measurement circuit 114 measures current which is input through the common substrate common line 12 and the first terminal 40 at a predetermined time and flows through the upstream region of an inspection interconnect 111. The predetermined time is described later. For example, the predetermined time is a time when all the pixels 20 (organic EL elements 18) are in the off-state. When all the pixels 20 are in the off-state, the operating transistor Q2 of all the pixels 20 are in the off-state. A current which causes the organic EL elements 18 to be turned on is supplied to the sources of the operating transistors Q2 of all the pixels 20 from the inspection signal generation circuit 210 through the second terminal 42. However, a current ideally does not flow through the organic EL elements 18 if the operating transistors Q2 of all the pixels 20 are turned off. The operating transistors Q2 are turned off by setting the gates of the operating transistors Q2 at an OFF-potential. Specifically, it suffices that the holding potential of the storage capacitors Cs be a potential equal to or lower than the OFF-potential. For example, the pixel select transistors Q1 of all the pixels 20 are turned on, and the storage capacitors Cs are discharged through the source lines 14 and the pixel select transistors Q1.

A current ideally does not flow when all the pixels 20 are set to the off-state. However, a leakage current or the like actually occurs even if all the pixel 20 are not defective. If one of the pixel 20 is defective, a leakage current or the like may be increased in the pixel 20. For example, even if the current which flows through the normal organic EL element 18 is 1 μA or less, a leakage current or the like at the time of occurrence of defects may reach about 100 times the current which flows through the normal organic EL element 18.

A leakage current, a steady-state current, or the like which flows through the common substrate common line 12 when all the pixels 20 (organic EL elements 18) are in the off-state is called a first current (or leakage current) $I_L$. The level of the first current is indicated by a level $L_0$ shown in FIG. 5 after current-voltage conversion by the I–V amplifier 118.

The CPU 115 causes the correction current generation circuit 116 to generate a correction current Ic ($Ic \approx -I_L$) in order to substantially cancel the first current $I_L$ measured by the current measurement circuit 114. The output line of the correction current generation circuit 116 is connected with the downstream region of the inspection interconnect 111. Therefore, when the current which flows through the common substrate common line 12 at the time of inspection is denoted by I, a current (I+Ic) is supplied to the I–V amplifier 118.

The current I which flows through the common substrate common line 12 at the time of inspection in which one of the pixels 20 is set to the on-state is substantially equal to the sum of an ON-pixel current $I_P$ which flows through the organic EL element 18 of the pixel 20 in the on-state and the first current (leakage current) $I_L$. Specifically, I=pixel current $I_P$+leakage current $I_L$.

Therefore, when one of the pixels 20 is turned on, the current (I+Ic) supplied to the I-V amplifier 118 becomes a current ($I_P$+$I_L$+Ic). This means that only the ON-pixel current $I_P$ can be supplied to the I–V amplifier 118 taking Ic≈−$I_L$ into consideration. The ON-pixel current $I_P$ is subjected to current-voltage conversion by the I–V amplifier 118, and subjected to analog-digital conversion by an ADC, whereby an ON-pixel voltage is obtained.

In this embodiment, the organic EL element 18 of one pixel 20 is set to the off-state after being turned on before the organic EL element 18 of the next pixel 20 is turned on, and all the pixels 20 are set to the off-state. In this case, when the current which flows through the common substrate common line 12 is I, a current (I+Ic) is supplied to the I–V amplifier 118. However, since I=$I_L$ and Ic≈−$I_L$, the current (OFF-pixel current) supplied to the I–V amplifier 118 substantially becomes zero. The OFF-pixel current is subjected to current-voltage conversion by the I–V amplifier 118, whereby an OFF-pixel voltage is obtained.

The ON-pixel voltage and the OFF-pixel voltage of each pixel 20 are input to the defect judgment circuit 150 shown in FIG. 2. Specifically, when the ON-pixel voltage which is input n-th (n is a positive integer) is input, the OFF-pixel voltage is input (n+1)th.

The defect judgment circuit 150 judges a defect of each pixel 20 based on the difference between the ON-pixel voltage and the OFF-pixel voltage for each pixel 20. The defect judgment circuit 150 includes a delay circuit 152 which delays the n-th ON-pixel voltage, a first sample-hold circuit 154 which samples and holds the output from the delay circuit 152, and a second sample-hold circuit 156 which samples and holds the (n+1)th OFF-pixel voltage. The defect judgment circuit 150 further includes a subtraction circuit 158 which subtracts between the outputs from the first and second sample-hold circuits 154 and 156, an ADC 159 which performs analog-digital conversion of the output from the subtraction circuit 158, and a judgment circuit 160 which judges a defect of the pixel 20 based on the subtraction result.

Inspection Method

Figure 4:
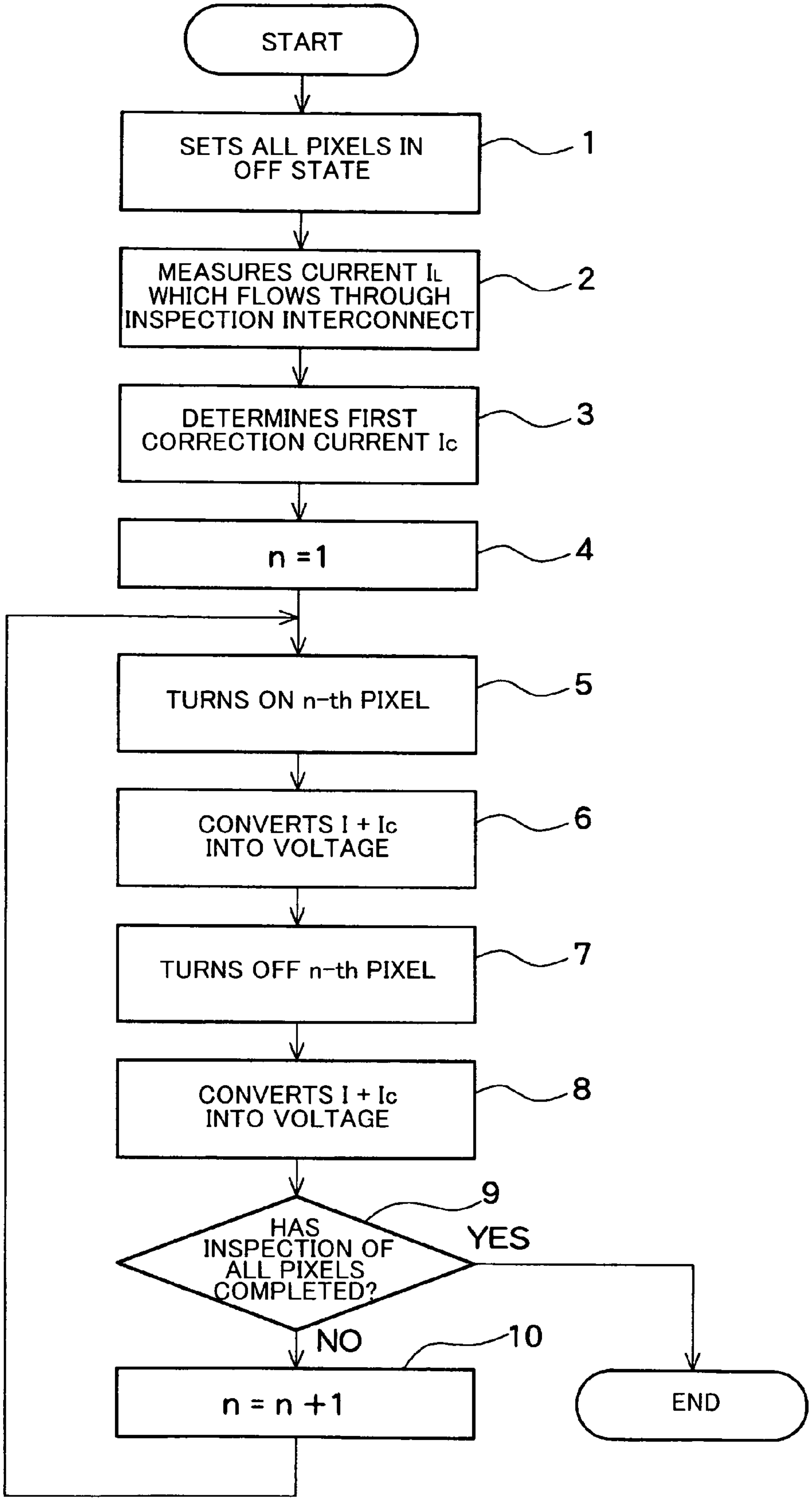
FIG. 4 is an operation flowchart of the first embodiment of the present invention.

The inspection method of this embodiment is described below with reference to FIG. 4. All the pixels 20 are set to the off-state (step 1), and the first current (leakage current) $I_L$ which flows through the inspection interconnect 111 through the common substrate common line 12 and the first terminal 40 is measured by the current measurement circuit 114 (step 2). The CPU 115 determines the correction current Ic generated by the correction current generation circuit 116 based on the measured current (step 3). n is set at one (step 4), and inspection of the n-th pixel 20 is started.

The n-th pixel 20 is turned on (step 5), and the sum of the current I which flows through the common substrate common line 12 and the correction current Ic (I+Ic≈$I_P$−Ic+Ic≈$I_P$) is subjected to current-voltage conversion by the I–V amplifier 118 and is converted into a digital value by the ADC 120 to obtain the ON-pixel voltage (step 6).

The n-th pixel 20 is turned off (step 7), and the sum of the current I which flows through the common substrate common line 12 and the correction current Ic (I+Ic≈Ic−Ic≈0) is subjected to current-voltage conversion by the I–V amplifier 118 to obtain the OFF-pixel voltage (step 8). The defect judgment circuit 150 calculates the difference between the ON-pixel voltage and the OFF-pixel voltage by the subtractor 158, and the judgment circuit 160 judges a defect of the n-th pixel based on the difference.

After the measurement of the n-th pixel 20 has been completed, n is set at n+1 (step 10) unless inspection of all the pixels 20 is completed (judgment in step 9 is NO), and the steps 5 to 10 are repeated.

Figure 5:
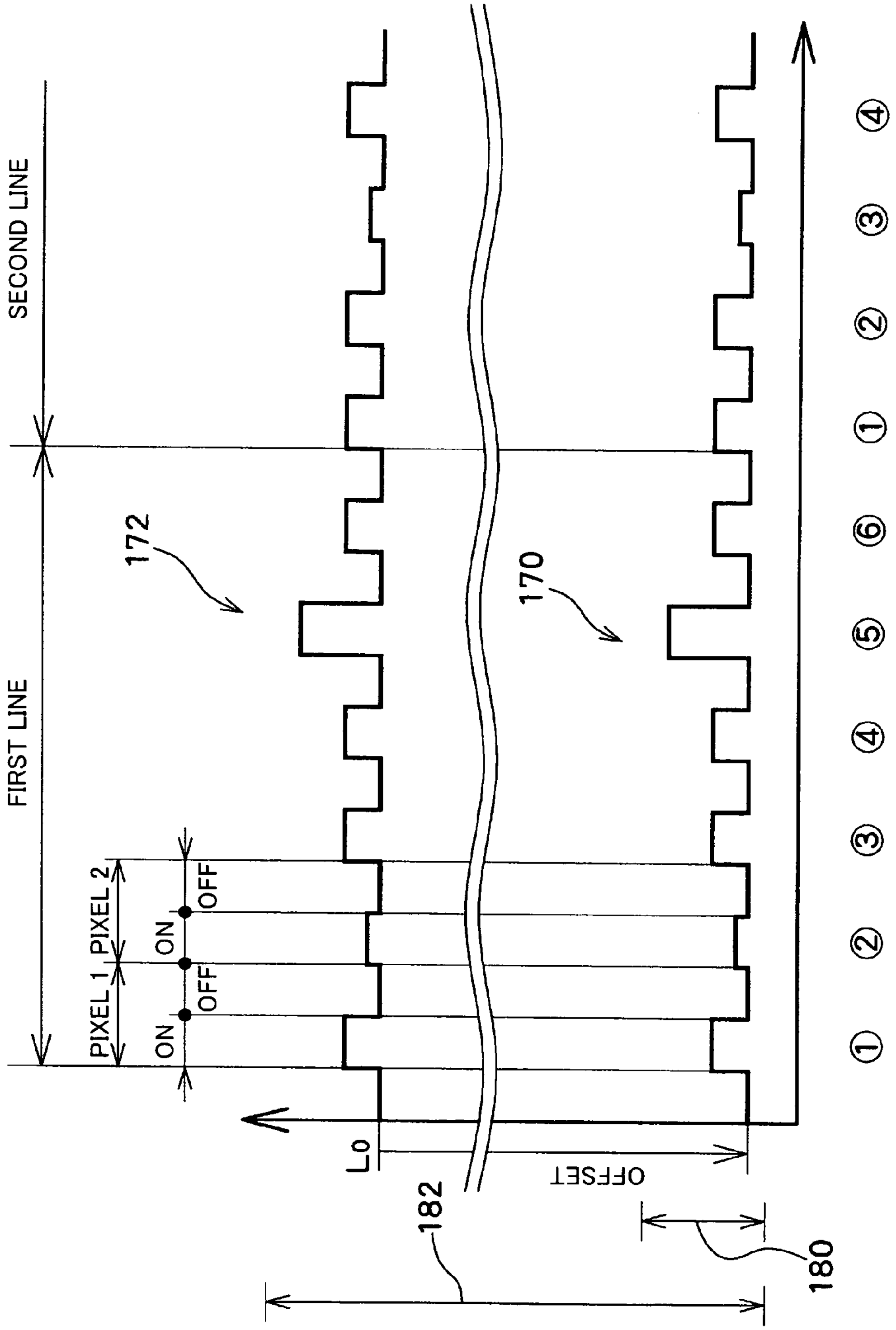
FIG. 5 is a measurement waveform diagram obtained by the first embodiment of the present invention.

FIG. 5 shows an output waveform 170 of the ADC 120 shown in FIG. 2 obtained by the inspection method of this embodiment, and an output waveform 172 of the ADC 120 as a comparative example which is not corrected by the correction current Ic. As described above, the ON-pixel voltage and the OFF-pixel voltage appear for each pixel 20 as the output waveforms 170 and 172 of the ADC 120.

In the output waveform 172 of the comparative example, the OFF-pixel voltage is equal to the voltage $L_0$ corresponding to the leakage current for all the pixels. In other words, the voltage $L_0$ for the first current (leakage current) which flows through the common substrate common line 12 when all the pixels 20 are in the off-state is added to the output waveform 172. Therefore, if the output waveform is not offset by the correction current Ic as in this embodiment, the I–V amplifier 118 and the ADC 120 require a wide dynamic range 182 shown in FIG. 5. Even if N bits (maximum bits of the ADC 120) are assigned to such a wide dynamic range 182, since most of the N bits are assigned to the voltage $L_0$ for the leakage current, the resolution of the output waveform 172 is extremely low.

On the other hand, the voltage $L_0$ for the leakage current is removed from the output waveform 170 of this embodiment. Therefore, the OFF-pixel voltage of the output waveform 170 of this embodiment is substantially equal to zero. Therefore, a dynamic range 180 shown in FIG. 5 can be assigned to the output waveform 170, whereby the resolution of the output waveform 170 is significantly increased. In other words, the resolution of the output waveform 170 can be increased even if the dynamic range 180 of the I–V amplifier 118 is made narrow.

In the example shown in FIG. 5, the second and fifth pixels 20 in the first row are defective, and the third pixel 20 in the second row is also defective.

Modification of Measurement Circuit

Figure 6:
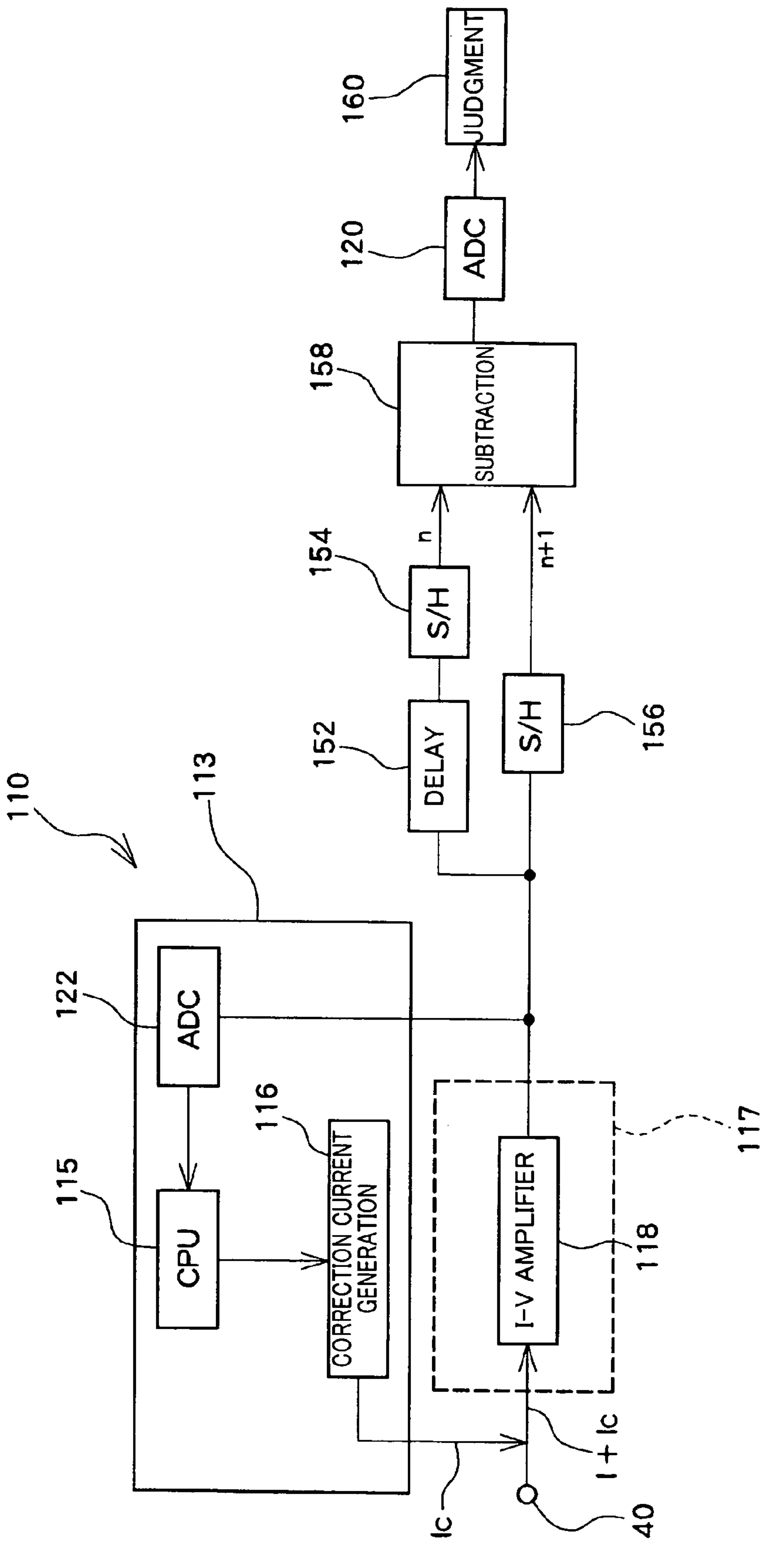
FIG. 6 is a block diagram showing a modification of an inspection circuit differing from FIG. 2.

FIG. 6 shows a circuit example in which a part of the pixel current detection circuit 110 of the inspection circuit 100 shown in FIG. 2 is changed. In FIG. 6, the current measurement circuit 114 shown in FIG. 2 is omitted. The output from the I–V amplifier 118 is input to the CPU 115 through the ADC 122. In this case, the CPU 115 may determine the correction current Ic output from the correction current generation circuit 116 based on the signal from the ADC 122 so that the voltage level $L_0$ corresponding to the leakage current in FIG. 5 corresponds to the least significant bit of the digital value which is the output of the ADC 122.

Figure 7:
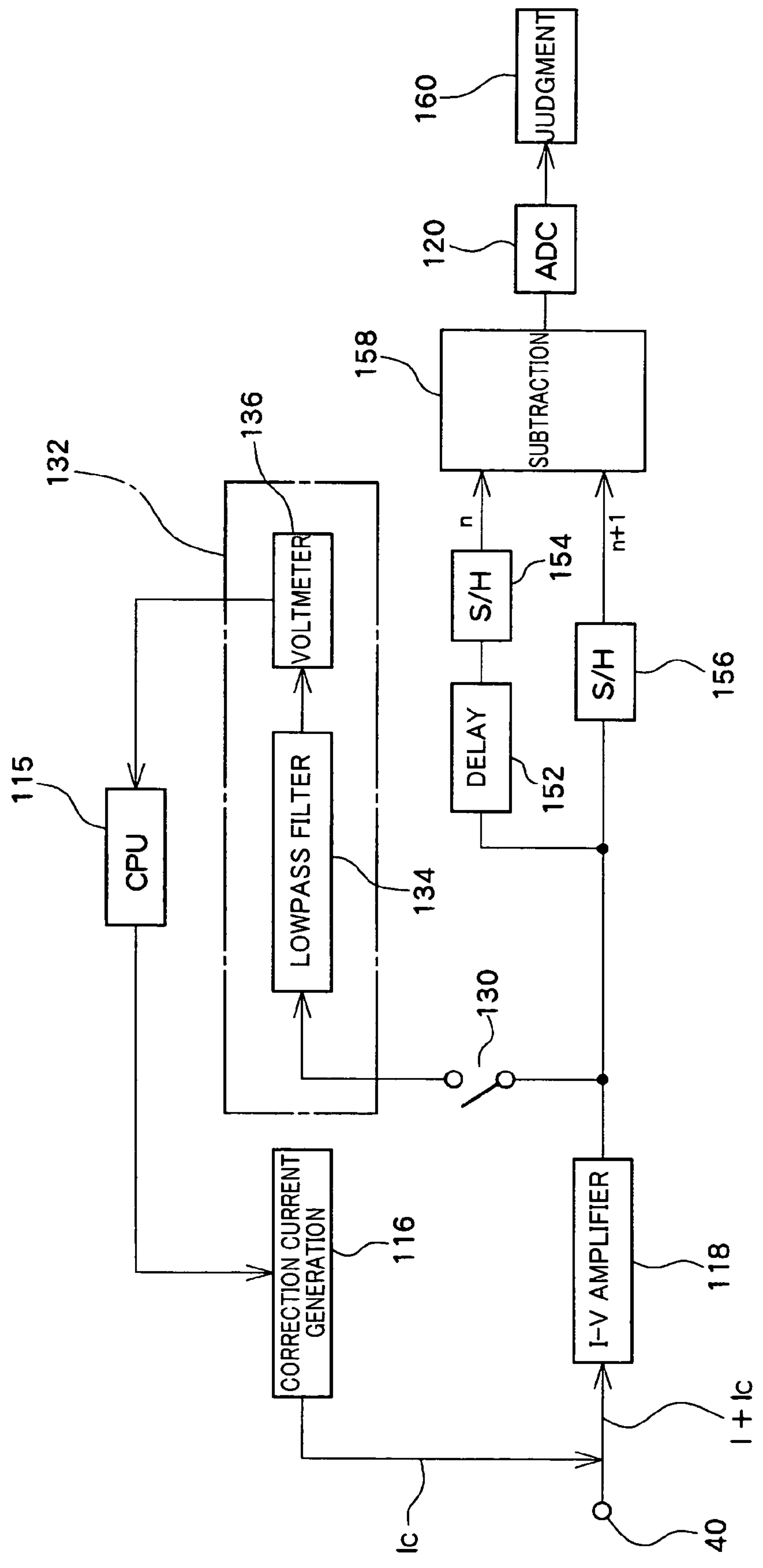
FIG. 7 is a block diagram showing another modification of an inspection circuit differing from FIG. 2.

FIG. 7 shows another circuit example in which a part of the pixel current detection circuit 110 of the inspection circuit 100 shown in FIG. 2 is changed. In FIG. 7, the current measurement circuit 114 shown in FIG. 2 is omitted. A voltage detection circuit 132 to which the output from the I–V amplifier 118 is input through a switch 130 is provided. The voltage detection circuit 132 includes a lowpass filter 134 and a voltmeter 136 which measures the output from the lowpass filter 134. In FIG. 7, the current measurement performed in FIG. 2 is replaced by voltage measurement after current-voltage conversion by the I–V amplifier 118. The lowpass filter 134 shown in FIG. 7 allows the voltage level $L_0$ corresponding to the leakage current shown in FIG.

4 to pass as a DC component, and is used to remove high-frequency components other than the voltage level $L_0$.

Second Embodiment

In the second embodiment, one of the pixels 20 is inspected by setting the pixel to the on state, and the next pixels are inspected by sequentially setting the pixels to the on state while maintaining the on state (without setting the pixels to the off-state).

Figure 8:
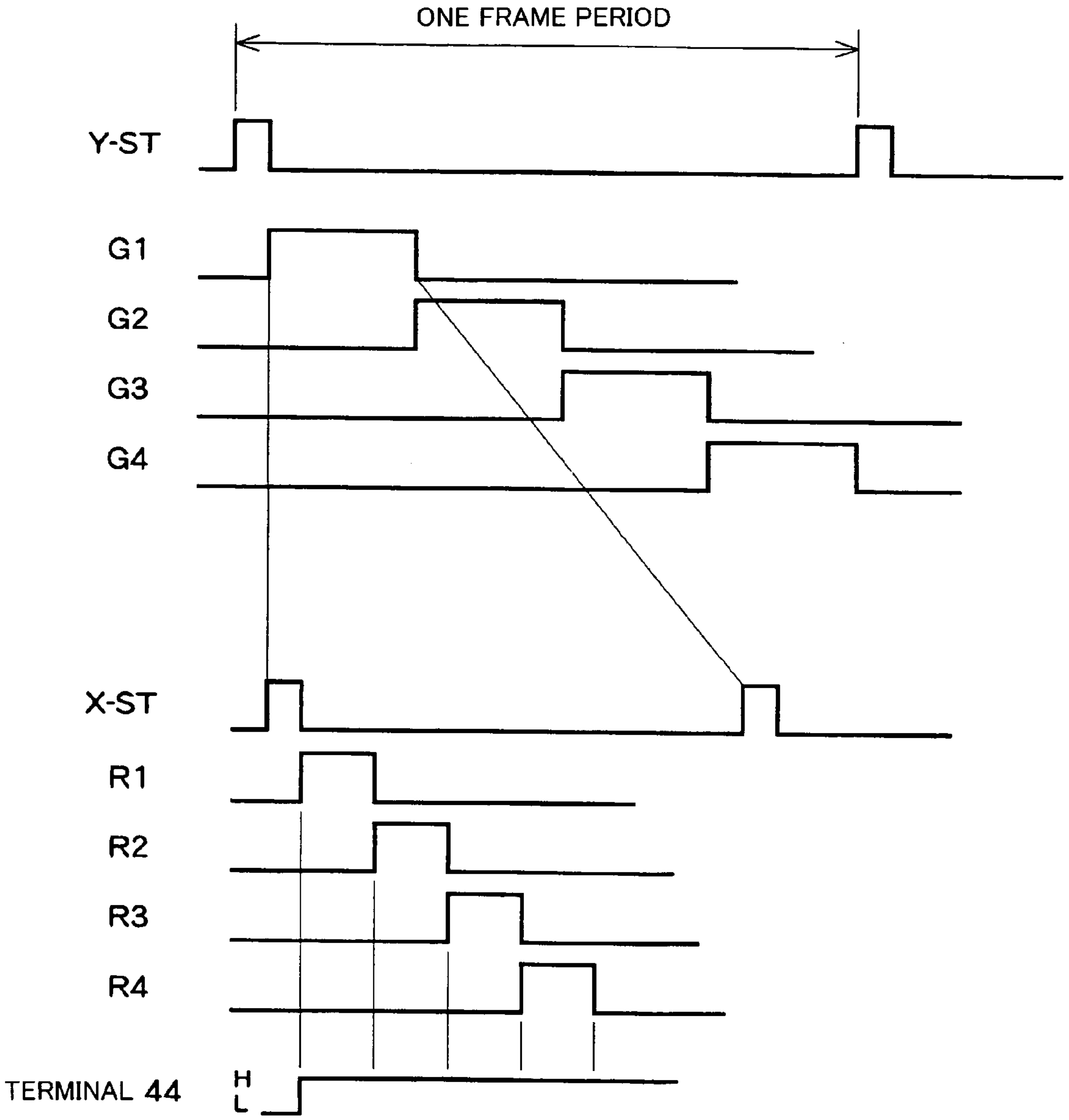
FIG. 8 shows a drive waveform of an inspection target used in a second embodiment of the present invention.

In order to realize such a drive, various signals are generated as shown in FIG. 8 based on the signals from the inspection signal generation circuit 210 and the control signal generation circuit 220 shown in FIG. 1. FIG. 8 differs from FIG. 3 in that the potential supplied to each source line 14 from the inspection signal generation circuit 210 through the third terminal 44 in a period in which all the pixels 20 are inspected within one frame is maintained at the charging potential H which charges the storage capacitor Cs of each pixel 20 through the pixel select transistor Q1 and is not set at the discharging potential L. However, in this embodiment, the potential supplied to each source line 14 from the inspection signal generation circuit 210 through the third terminal 44 is set at the discharging potential L when measuring the first current (leakage current) $I_L$.

Figure 9:
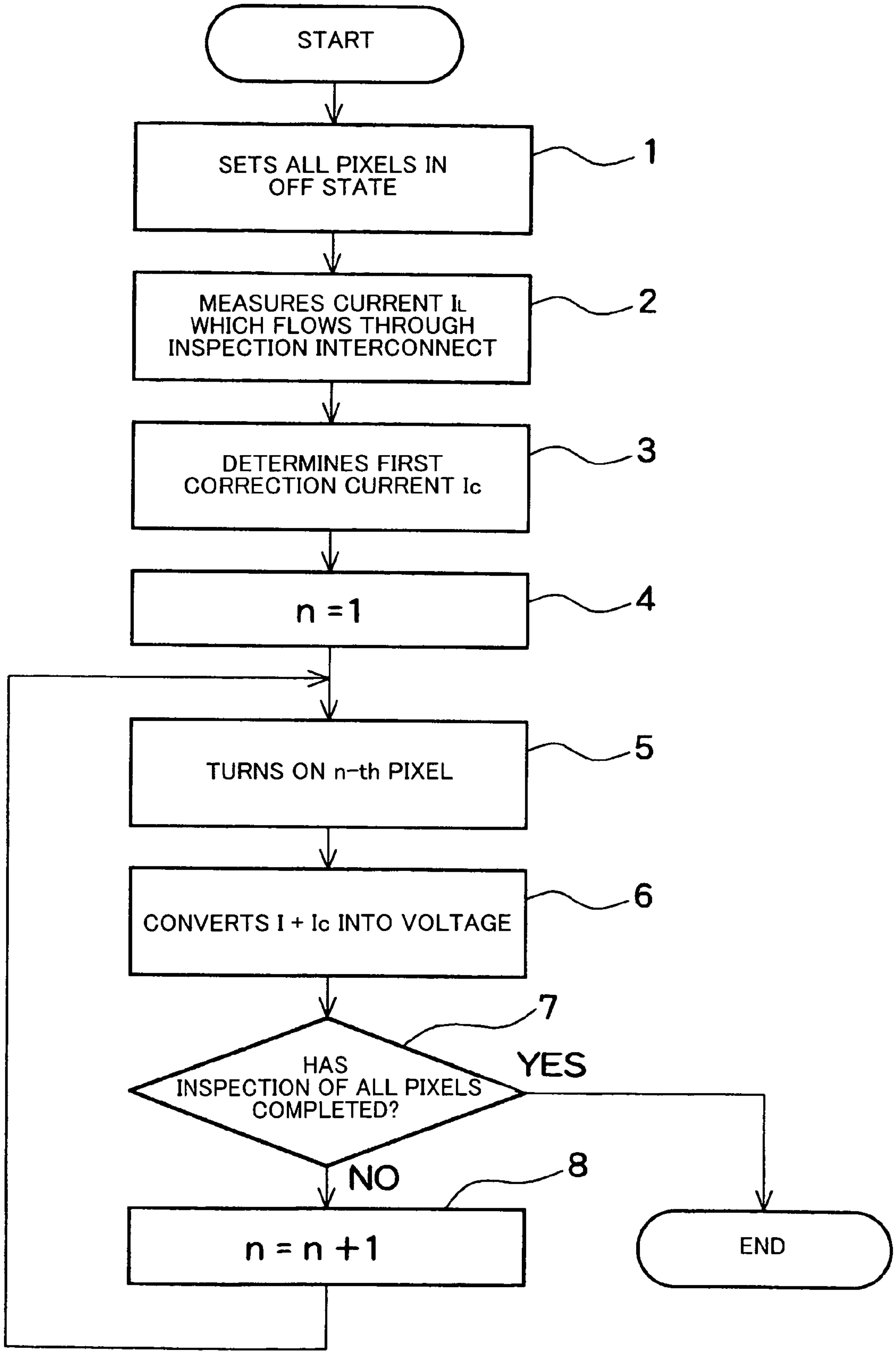
FIG. 9 is an operation flowchart of an embodiment in which a correction current is not updated in the second embodiment of the present invention.

FIG. 9 is an operation flowchart of the second embodiment. In FIG. 9, the steps 7 and 8 in FIG. 4 are omitted, and the steps 9 and 10 in FIG. 4 are changed to steps 7 and 8. Specifically, the step of measuring the OFF-pixel current (or voltage) by setting each pixel 20 to the off-state is omitted.

Figure 10:
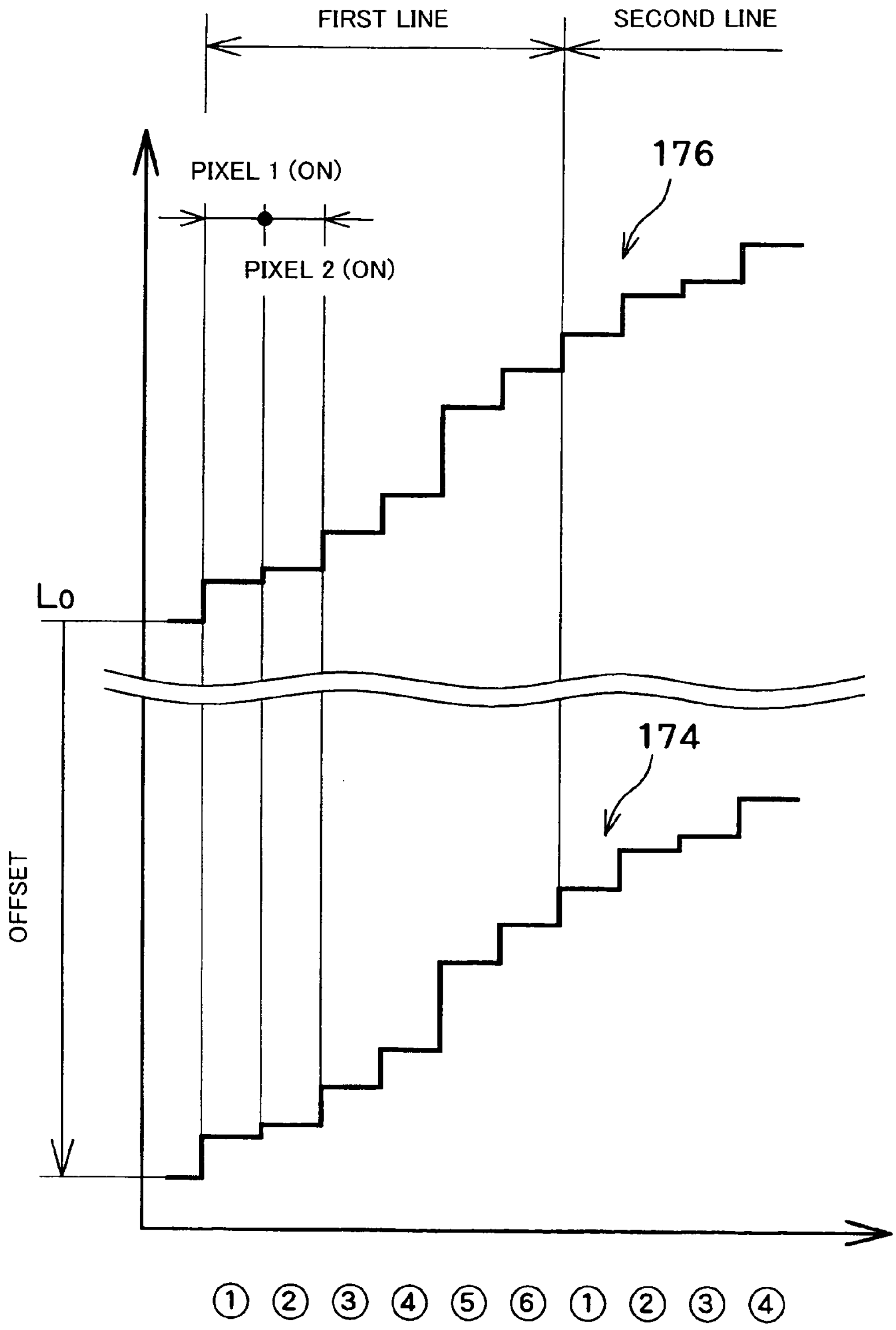
FIG. 10 is a measurement waveform diagram obtained by an operation according to the flowchart shown in FIG. 9.

FIG. 10 shows the inspection results measured according to the timing chart shown in FIG. 9. FIG. 10 shows an output waveform 174 of the ADC 120 shown in FIG. 2 obtained by the inspection method of the second embodiment, and an output waveform 176 of the ADC 120 as a comparative example which is not corrected by the correction current Ic. As described above, only the ON-pixel voltage appears for each pixel 20 as the output waveforms 174 and 176 of the ADC 120. In FIG. 10, since the inspection target pixel 20 is not set to the off-state before measuring the ON-pixel current (voltage) of each pixel 20, the ON-pixel current (voltage) of each pixel 20 is sequentially superimposed, whereby a staircase wave is obtained as shown in FIG. 10.

However, in FIG. 10, the voltage $L_0$ corresponding to the leakage current $I_L$ is added to the output waveform 176 of the comparative example for all the pixels 20 in the same manner as in FIG. 3. Therefore, the I–V amplifier 118 requires a wide dynamic range and the resolution of the output waveform 176 is extremely low as described with reference to FIG. 3.

On the other hand, since the voltage $L_0$ for the leakage current is removed from the output waveform 174 of the second embodiment, the resolution of the output waveform 174 can be increased.

The staircase wave of the output waveform 174 shown in FIG. 10 is collected for all the pixels 20 in one frame. Therefore, the second embodiment is suitable for a display device in which the number of pixels is small. However, if a normal display device in which the total number of pixels is several hundreds of thousands or more is employed as the inspection target, a wide dynamic range is necessary although the output waveform is improved in comparison with the output waveform 176.

Therefore, the application range can be increased to a display device in which the number of pixels is great by remeasuring the correction current Ic for each predetermined pixel and updating the amount of offset of the ON-pixel current (voltage) for each predetermined pixel. This modification is described below using the following two examples.

In the first example, a second current which flows through the common substrate common line 12 is measured each time the inspection step is completed for the pixels for one line of a display device, a second correction current which substantially cancel the second current is generated instead of the first correction current, and the second correction current is updated each time the inspection step is completed for the pixels for one line of the display device.

Figure 11:
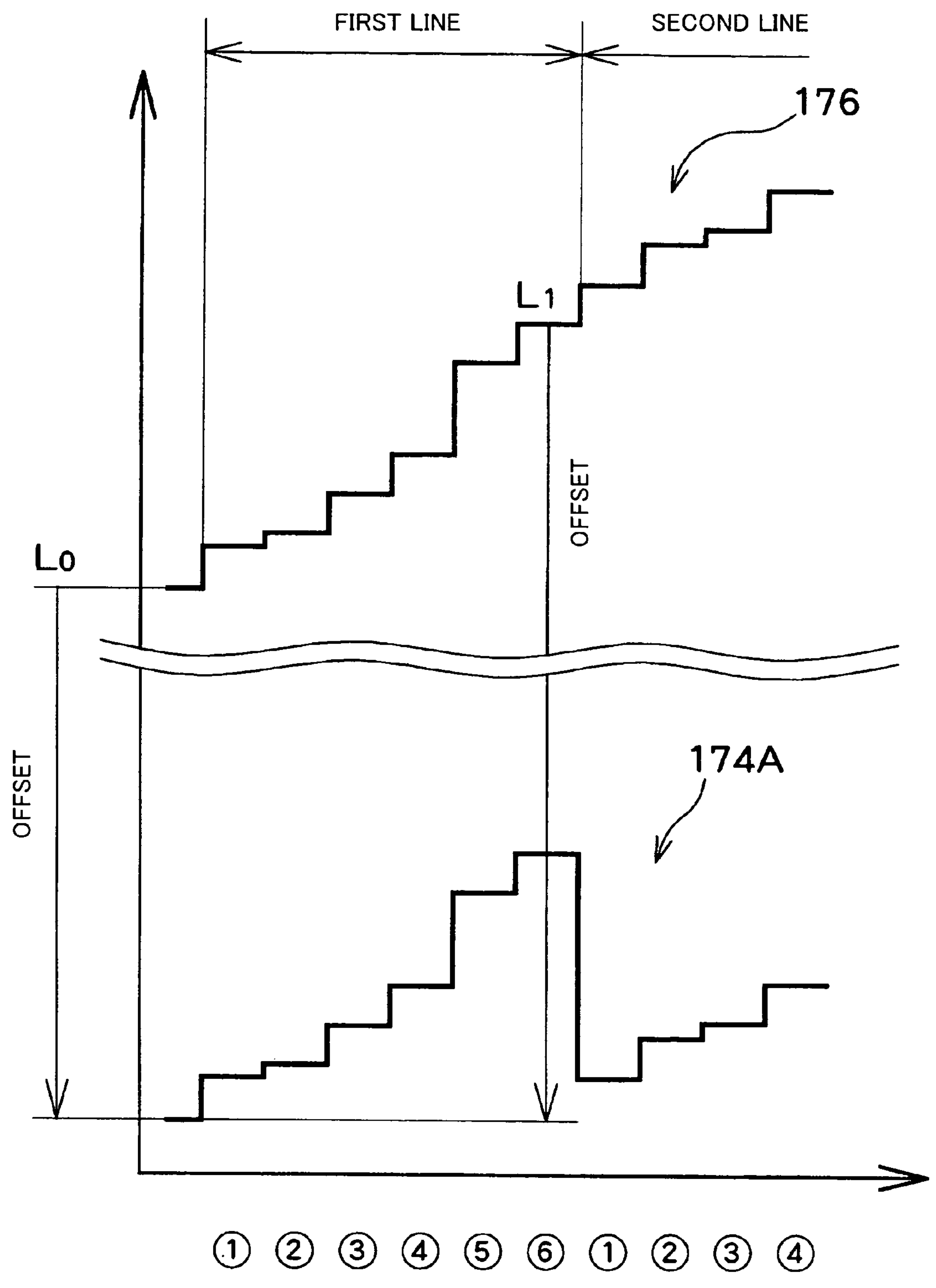
FIG. 11 is a measurement waveform diagram obtained by an embodiment in which a correction current is updated for each line in the second embodiment of the present invention.

An output waveform 174A of the sixth pixel in the first line in FIG. 11 is offset for the voltage level $L_0$ corresponding to the first current when all the pixels 20 are set to the off-state (corresponding to the first correction current) (the same as the first embodiment). The output waveform 174A of the pixels in the second line is offset for a voltage level $L_1$ corresponding to the second current when the six pixels 20 in the first line are set to the on-state (corresponding to the second correction current). A staircase wave offset with the value updated for each line is obtained as shown in FIG. 11 by updating the second correction current for each line. Therefore, the resolution of the output waveform 174A shown in FIG. 11 is significantly increased in comparison with the resolution of the output waveform 174 shown in FIG. 10.

Figure 12:
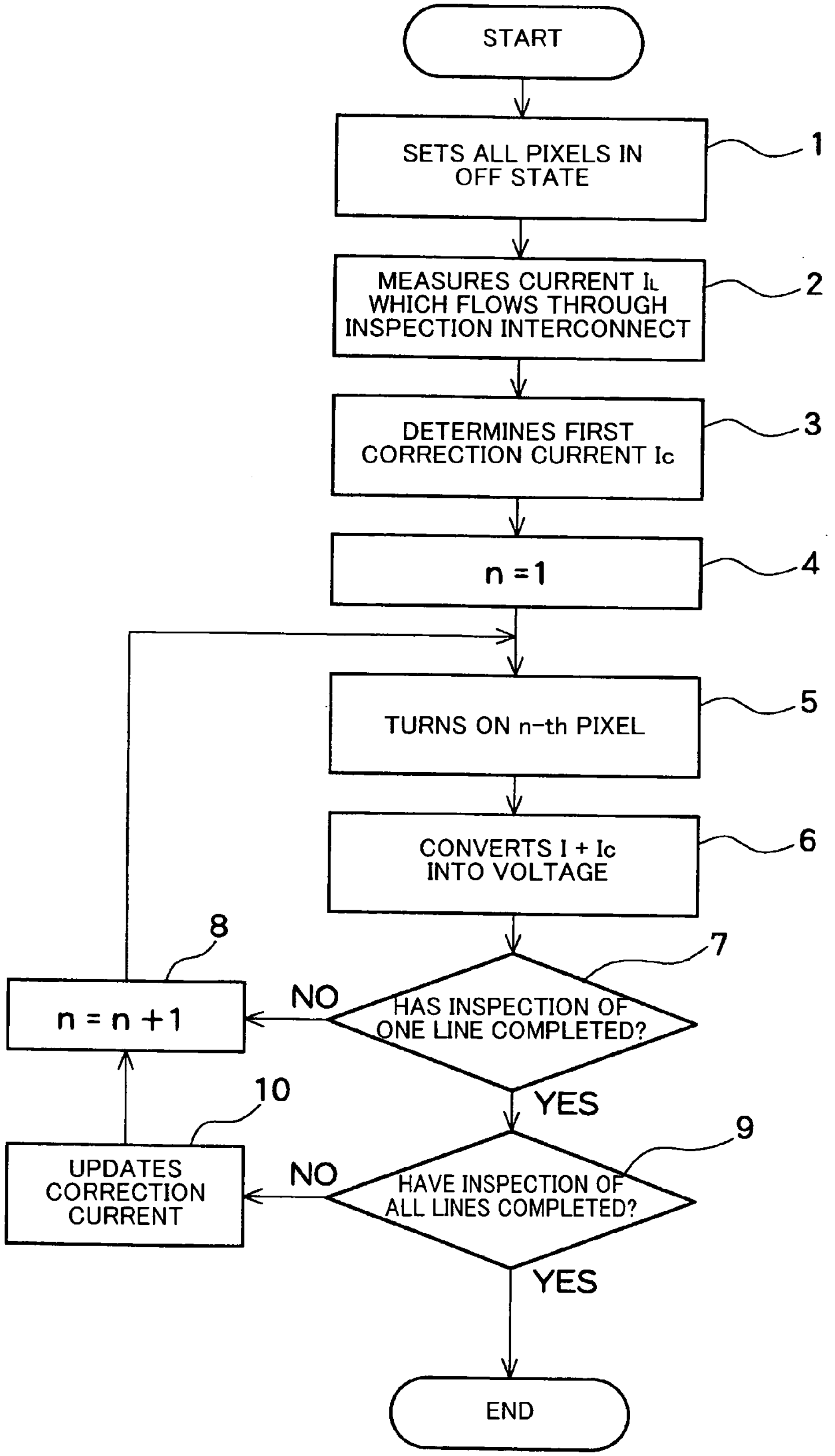
FIG. 12 is an operation flowchart for obtaining measurement results shown in FIG. 11.

FIG. 12 is an operation flowchart for obtaining the output waveform 174A shown in FIG. 11. Steps 1 to 6 in FIG. 12 are the same as those in FIG. 9. In a step 7 in FIG. 12, whether or not pixel inspection for one line has been completed is judged. If inspection for one line has not been completed, n is set at n+1 (step 8), and the steps 5 to 8 are repeated. When inspection for one line has been completed (judgment in the step 7 is YES) and judgment for completion of all the lines is NO in a step 9, the correction current is updated (step 10). The processing then returns to the step 5 through a step 8.

In the other example, the second current which flows through the common substrate common line 12 is measured each time the inspection step is completed for each pixel of a display device, the second correction current which substantially cancels the second current is generated instead of the first correction current, and the second correction current is updated each time the inspection step is completed for each pixel of the display device.

Figure 13:
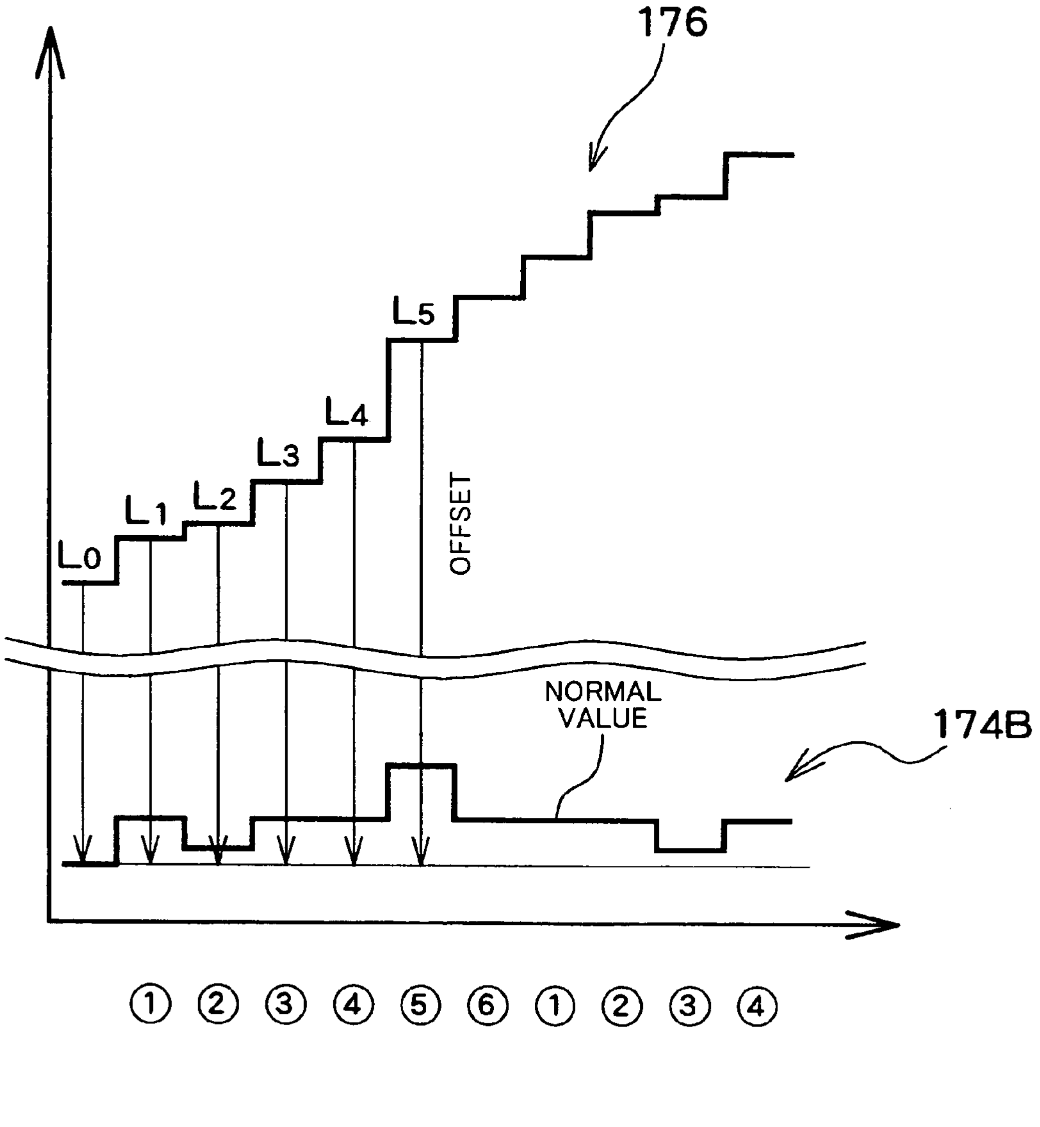
FIG. 13 is a measurement waveform diagram obtained by an embodiment in which a correction current is updated for each pixel in the second embodiment of the present invention.

An output waveform 174B of the first pixel in the first line in FIG. 13 is offset for the voltage level $L_0$ corresponding to the first current when all the pixels 20 are set to the off-state (corresponding to the first correction current) (the same as the first embodiment). The output waveform 176 of the second pixel in the first line is offset for the voltage level $L_1$ corresponding to the second current when the first pixel in the first line is set to the on-state (corresponding to the second correction current). The output waveform 174B which is offset with the value updated for each pixel is obtained as shown in FIG. 11 by updating the second correction current in the order of $L_2 \rightarrow L_3 \rightarrow L_4 \rightarrow L_5$ . . . for each pixel. Therefore, the resolution of the output waveform 174B shown in FIG. 13 is significantly increased in comparison with the resolution of the output waveform 174 shown in FIG. 10 and the output waveform 174A shown in FIG. 11.

Figure 14:
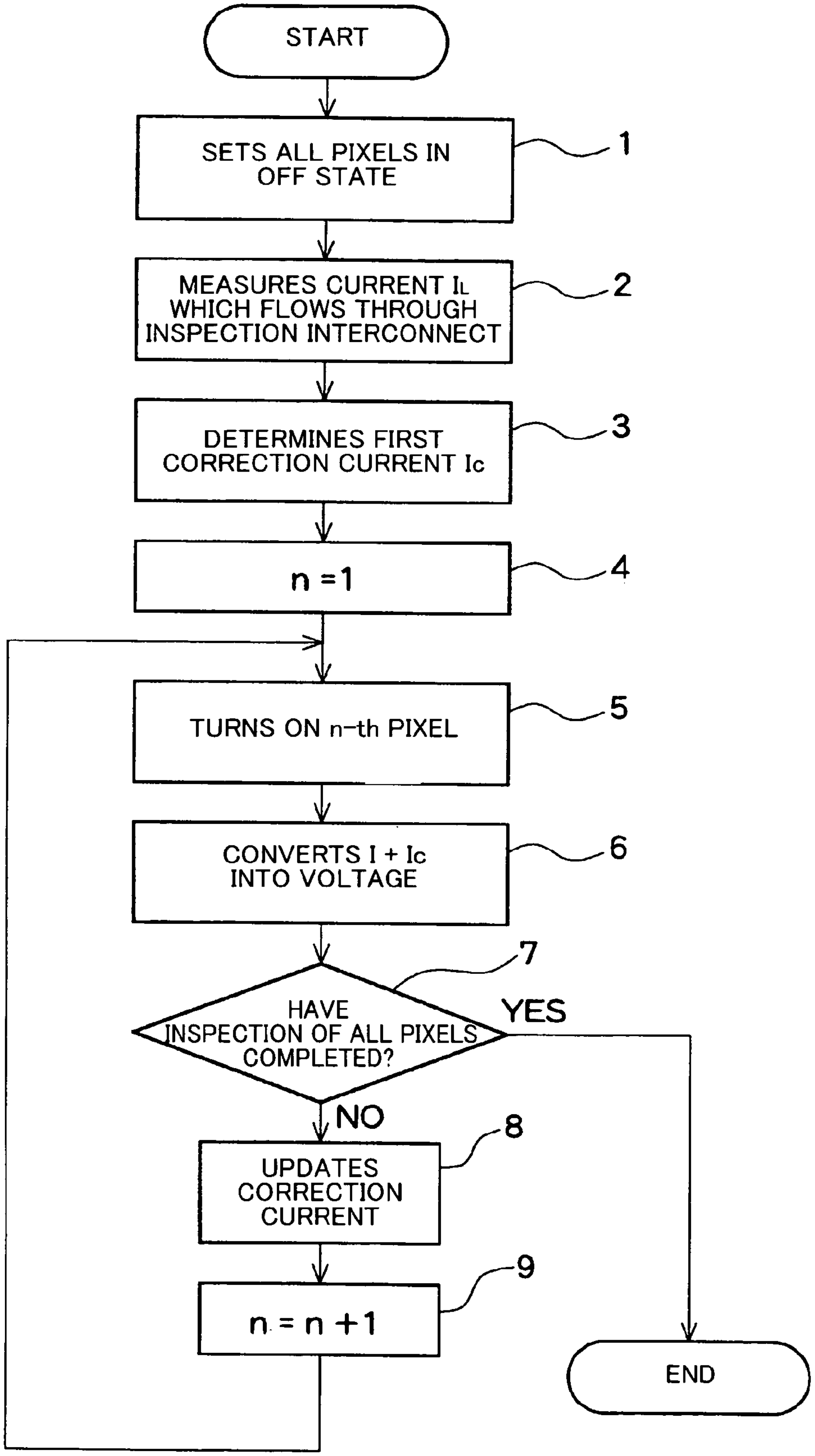
FIG. 14 is an operation flowchart for obtaining measurement results shown in FIG. 13.

FIG. 14 is an operation flowchart for obtaining the output waveform 174B shown in FIG. 13. Steps 1 to 6 in FIG. 14 are the same as those in FIGS. 9 and 12. In a step 7 in FIG. 14, whether or not inspection for all the pixels has been completed is judged. When inspection for all the pixels has not been completed, the correction current is updated (step 8) and n is set at n+1 (step 9). Then, the steps 5 to 9 are repeated.

The output waveform 174 (FIG. 10), the output waveform 174A (FIG. 11), and the output waveform 174B (FIG. 13) may be obtained by the second embodiment by using the current detection circuit 150 shown in any of FIGS. 2, 6, and 7. In the second embodiment, a defect of each pixel 20 is judged based on the output waveform 174 (FIG. 10), the output waveform 174A (FIG. 11), or the output waveform 174B (FIG. 13). However, the defect judgment circuit 150 shown in FIG. 1 used in this case differs from the defect judgment circuit shown in FIG. 2, 6, or 7. This is because it is unnecessary to calculate the difference between the ON-pixel voltage and the OFF-pixel voltage in the defect judgment. In the case of the output waveform 174 (FIG. 10) and the output waveform 174A (FIG. 11), a defect may be judged by calculating the difference between the ON-pixel voltages of the adjacent pixels and comparing the difference with an allowable range. In the output waveform 174B (FIG. 13), the normal pixels have a constant value as shown in FIG. 13. Therefore, a pixel defect can be judged by detecting whether or not the ON-pixel voltage is within the allowable range of the constant value.

Third Embodiment

Figure 15:
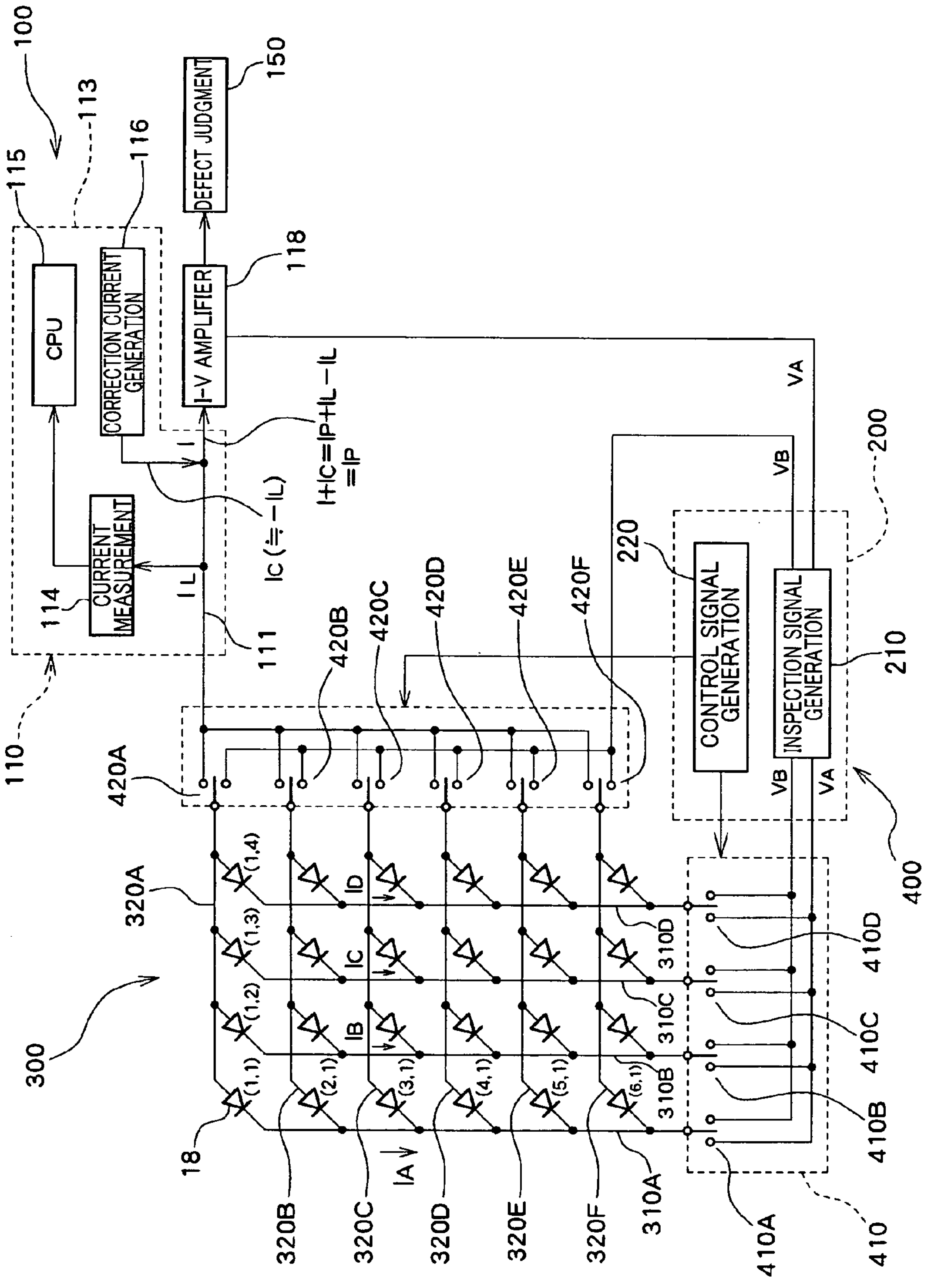
FIG. 15 shows an inspection device and an inspection target (passive matrix type organic EL display device) of a third embodiment of the present invention.

This embodiment illustrates the case where the present invention is applied to a passive matrix type organic EL display device. In FIG. 15, a plurality of organic EL elements 18 are disposed in a passive matrix type organic EL display device 300 in the shape of a matrix. One end of the organic EL elements 18 in each column is connected in common with a first interconnect 310 (310A to 310D) which extends along each column. The other end of the organic EL elements 18 in each row is connected in common with a second interconnect 320 (320A to 320F) which extends along each row.

An inspection circuit 400 includes a first switch circuit 410 and a second switch circuit 420 in addition to the inspection circuit 100 and the defect judgment circuit 150 shown in FIGS. 1 and 2. The first switch circuit 410 includes column switches 410A to 410D connected with the first interconnects 310A to 310D in each column. The second switch circuit 420 includes row switches 420A to 420D connected with the second interconnects 320A to 320F in each row. The circuit shown in FIG. 6 or 7 may be used instead of the inspection circuit 100 and the defect judgment circuit 150 shown in FIG. 2.

The first switch circuits 410 individually switch the voltage of one end of the first interconnects 310A to 310D to a voltage $V_A$ ($V_{SS}$=0 V, for example) or a voltage $V_B$ ($V_B<V_A$, $V_A=V_{DD}$, for example). The second switch circuits 420 individually switch the voltage of one end of the second interconnects 320A to 320F to the voltage $V_A$ or the voltage $V_B$. A luminescence current flows through each organic EL element 18 when the voltage $V_B$ is applied to a cathode terminal (cathode) by the second switch circuit 420 and the voltage $V_A$ is applied to an anode terminal (anode) by the first switch circuit 410, whereby each organic EL element 18 emits light. The luminescence current does not flow in other cases insofar as the organic EL element 18 is normal. For example, a current does not flow when the voltage $V_A$ is applied to both ends of the organic EL element 18 by the first and second switch circuits 410 and 420. The luminescent current does not flow through the organic EL element 18 when the voltage $V_A$ is applied to the cathode terminal (cathode) by the second switch circuit 420 and the voltage $V_B$ is applied to the anode terminal (anode) by the first switch circuit 410.

Each terminal of the second switch circuits 420 on the side of the voltage $V_A$ is connected with the inspection interconnect 111 of the inspection device. In this embodiment, the voltage $V_A$ is supplied from the power supply of the I–V amplifier 18 of the pixel current detection circuit 110, for example. The inspection signal generation circuit 210 supplies the voltage $V_A$ supplied from the I–V amplifier 18 to each terminal of the first switch circuit 410 on the side of the voltage $V_A$.

The inspection method for the passive matrix type organic EL display device 300 shown in FIG. 15 is described below with reference to a flowchart shown in FIG. 16 and the timing chart shown in FIG. 5.

Figure 16:
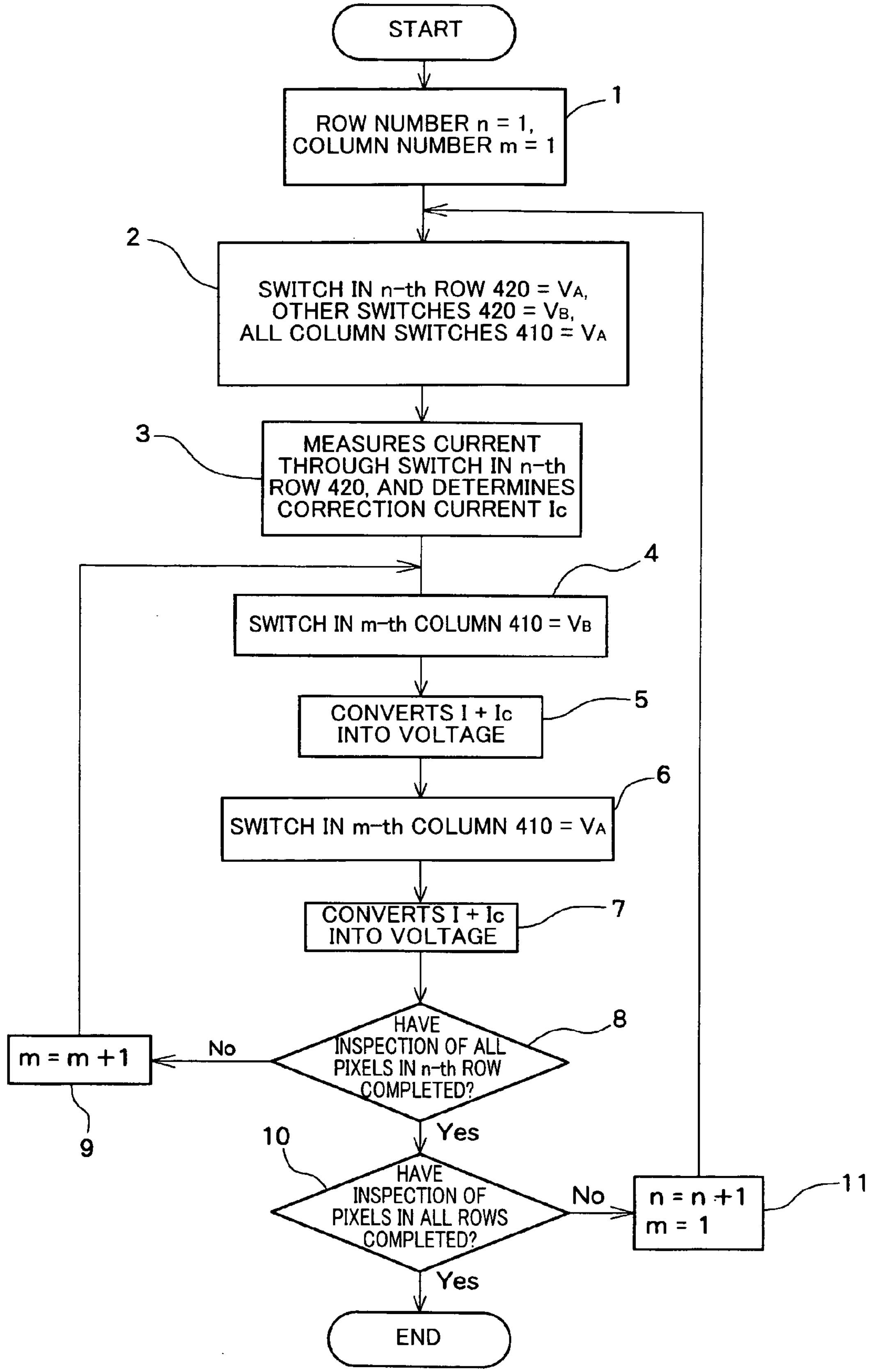
FIG. 16 is an operation flowchart of the third embodiment of the present invention.

As shown in FIG. 16, the row number n is set at 1 and the column number m is set at 1 as initial values (step 1). The row switch 420A in the n=1st row is switched to the voltage $V_A$ side, and the remaining row switches 420B to 420F are switched to the voltage $V_B$ side. All the column switches 410A to 410D are switched to the voltage $V_A$ side (step 2). The correction circuit 113 determines the correction current $I_C$ in this state in the same manner as in the step 3 in FIG. 4 or the like based on the leakage current $I_L$ which flows through the inspection interconnect 111 (step 3).

When the currents which flow through the first interconnects 310A to 310D are denoted by $I_A$ to $I_D$, $I_L$ equals $I_A+I_B+I_C+I_D$. A current originally does not flow through all the organic EL elements 18 by the setting in the step 1. However, the leakage current $I_L$ is measured when variation occurs such as when at least one of the column switches 410A to 410D in the first switch circuit 410A cannot be accurately switched to the voltage $V_A$. The leakage current $I_L$ flows when the organic EL elements 18 of all the pixels are set to the off-state.

The pixels (1, 1) to (1, 4) in the first row are sequentially inspected after correction using the correction current $I_C$.

Only the column switch 410A in the m=1st column is switched to the voltage $V_B$ side from the switch setting state in the step 2 (step 4). This causes only the organic EL element 18 of the pixel (1, 1) to emit light. Specifically, only the current $I_A$ which flows through the first interconnect 310A becomes the luminescence current, and the remaining currents $I_B$, $I_C$, and $I_D$ are under the same conditions as those at the time of measurement in the step 3.

A current under the conditions in the step 4 is input to the pixel current detection circuit 110 through the row switch 420A. The current I+Ic is converted into voltage in the same manner as in the step 6 in FIG. 4 (step 5). In this case, since the current input through the row switch 420A is canceled by the correction current Ic, the on-current of the pixel (1, 1) can be accurately evaluated. When the measurement of the ON-pixel (1, 1) is completed, the column switch 420A is switched to the voltage $V_B$ side to recover the state in the step 2 (step 6). The off-current of the pixel (1, 1) is converted into voltage in this state (step 7).

The judgment in the step 8 of FIG. 16 is NO since inspection for all the pixels in the column has not been completed, the column number is updated to m=m+1 (step 9), and the step 4 is performed again.

In the second step 4, only the column switch 410B in the m=2nd column is switched to the voltage $V_B$ side. This causes only the organic EL element 18 of the pixel (1, 2) to emit light. Specifically, only the current $I_B$ which flows through the first interconnect 310B becomes the luminescence current, and the remaining currents $I_A$, $I_C$, and $I_D$ are under the same conditions as those at the time of measurement in the step 3.

In the second step 5, since the current input through the row switch 420B is canceled by the correction current Ic, the on-current of the pixel (1, 2) can be accurately evaluated. The on-current of the pixel (1, 2) can be accurately evaluated by performing the steps 6 and 7.

The steps 8 and 9 are then performed. The pixels (1, 3) and (1, 4) can be inspected by repeating the steps 4 to 7.

After inspection of the last pixel (1, 4) in the n=1st row has been completed, the judgment in the step 8 becomes YES. Since the judgment in the step 10 becomes NO, n=n+1 and m=1 are set in the step 11, and the processing returns to the step 2. In the second step 2, only the row switch 420B in the n=2nd row is switched to the voltage $V_B$, and the remaining switches are switched to the voltage $V_A$. Then, the leakage current $I_C$ which flows through the row switch 420B is determined (step 3). The pixels (2, 1) to (2, 4) in the n=2nd row can be sequentially inspected by repeating the steps 4 to 9. The results obtained by this inspection are the same as those in the first embodiment. The results are the same as those shown in FIG. 5.

All the pixels can be inspected by performing the above-described operation while updating the value of the row number n.

Within the above-described operation, Table 1 shows the switching state of the first and second switch circuits 410 and 420 when inspecting the four pixels (m, 1) to (m, 4) in the column m.

TABLE 1

| | First switch circuit 410 | | | | Second switch circuit 420 | |
|---|---|---|---|---|---|---|
| | A | B | C | D | Switch in m-th column | Switches in columns other than m-th column |
| Correction current measurement | $V_A$ | $V_A$ | $V_A$ | $V_A$ | $V_A$ | $V_B$ |
| Inspection of (m, 1) | $V_B$ | $V_A$ | $V_A$ | $V_A$ | $V_A$ | $V_B$ |
| Inspection of (m, 2) | $V_A$ | $V_B$ | $V_A$ | $V_A$ | $V_A$ | $V_B$ |
| Inspection of (m, 3) | $V_A$ | $V_A$ | $V_B$ | $V_A$ | $V_A$ | $V_B$ |
| Inspection of (m, 4) | $V_A$ | $V_A$ | $V_A$ | $V_B$ | $V_A$ | $V_B$ |

The waveform obtained by the inspection method for the passive matrix type organic EL display device 300 is similar to the waveform in FIG. 5 performed for the active matrix type organic EL display device 1 in the first embodiment. The modifications shown in FIGS. 10, 11, and 13 are applied to the active matrix type organic EL display device 1. Similar modifications may be applied to inspection of the passive matrix type organic EL display device 300.

Fourth Embodiment

In the case of an active matrix type display device, each pixel can be inspected in a state of a active matrix substrate by the same principle as described above even if the display element does not necessarily exist.

Figure 17:
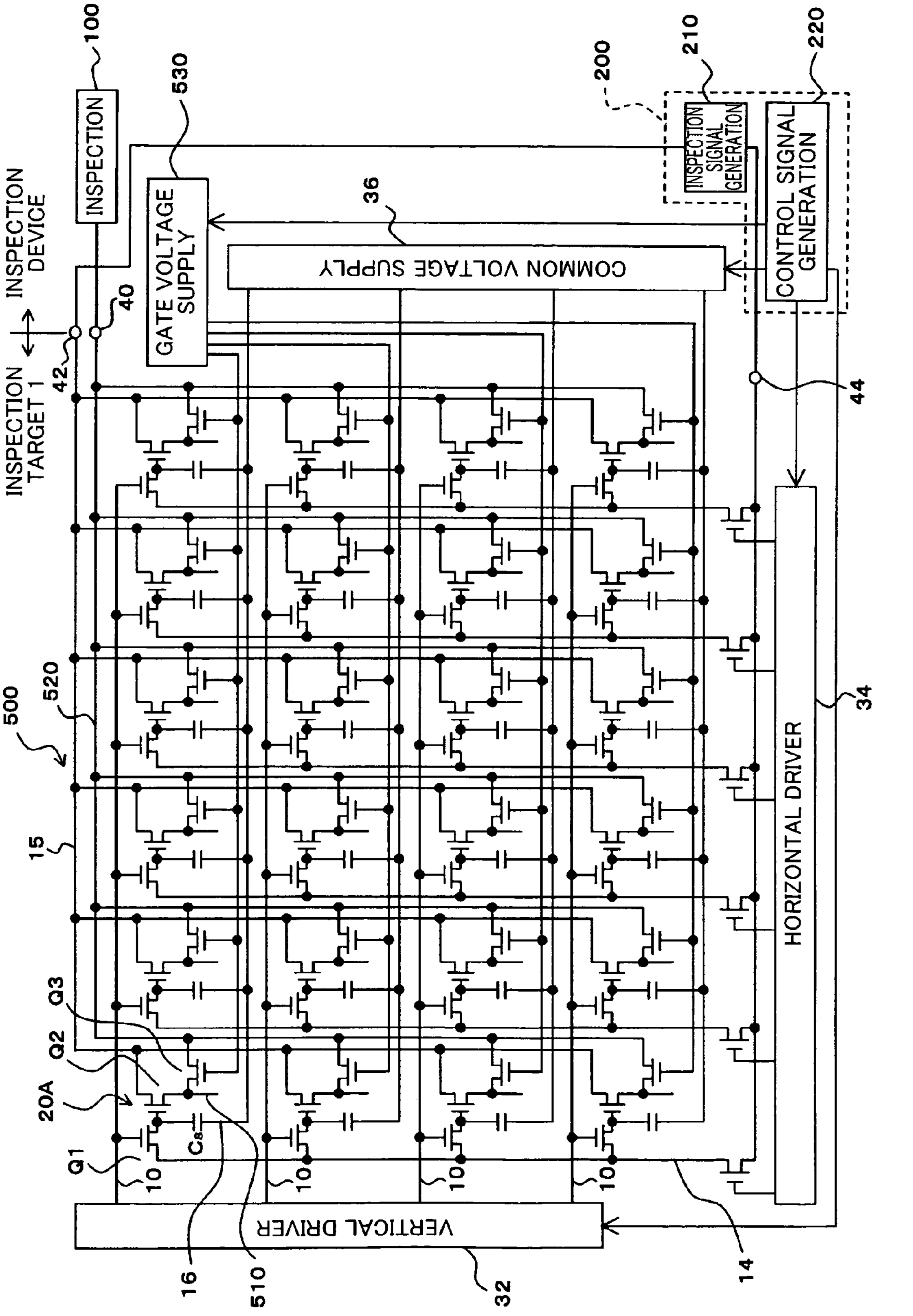
FIG. 17 shows an inspection device and an inspection target (active matrix substrate) of a fourth embodiment of the present invention.

FIG. 17 shows the case where an active matrix substrate 500 is connected with the inspection device 2 as the inspection target shown in FIG. 1 instead of a display device. In FIG. 17, members having the same function as the members shown in FIG. 1 are denoted by the same symbols. Description of these members is omitted.

The active matrix substrate 500 includes a plurality of pixels 20A, each of the pixels being connected with one of a plurality of signal lines (source lines) 14, one of a plurality of scan lines (gate lines) 10, one of a plurality of voltage supply lines (anode lines) 15, and a common line 16. Each of the pixels 20A includes the pixel select transistor Q1 connected with the signal line 14 and the scan line 10, the operating transistor Q2, and the storage capacitor Cs for holding the gate potential of the operating transistor Q2. A gate of the operating transistor Q2 is connected with one end of the storage capacitor Cs and the pixel select transistor Q1, one of a source and a drain of the operating transistor Q2 is connected with the voltage supply line (anode line) 15, and the cathode line 12 is an open terminal. The anode line 15 is connected with the second terminal 42. In this embodiment, the other end of the storage capacitor Cs is connected with the common line 16.

Since the display element 18 does not exist in the active matrix substrate 500 differing from the active matrix type organic EL element shown in FIG. 1, the drain (cathode line 510) of the operating transistor Q2 is an open terminal (usually an electrode).

The inspection method described in the first and second embodiments may be applied to the active matrix substrate 500. In this case, "the off-state of the pixel" in the display device may be replaced by "the off-state of the operating transistor", and "the on-state of the pixel" may be replaced by "the on-state of the operating transistor". For example, the step 1 in FIG. 4 may be performed by "turning off all the operating transistors" instead of turning off "all the pixels". The step 5 in FIG. 4 may be performed by turning on the n-th operating transistor and the step 7 in FIG. 4 may be performed by turning off the n-th operating transistor. This enables the inspection methods shown in FIGS. 9 and 12 to be applied to inspection of the active matrix substrate.

In order to detect the inspection current, an inspection interconnect 520 is connected with the cathode lines 510 of all pixels, and the inspection interconnect 520 is connected with the inspection terminal (first terminal) 40. However, the inspection interconnect 520 and the inspection terminal 40 are used only at the time of inspection, and are not used when completed as a display device. On the other hand, the finished product cannot be used if all the cathode lines 510 are short-circuited. Therefore, it is preferable to provide a reset circuit which controls connection/disconnection between the cathode line 510 and the inspection interconnect 520 in order to prepare for use as the finished product.

In FIG. 17, a switching transistor Q3 is formed on the active matrix substrate 500 as a reset circuit. A gate voltage supply circuit 530 is provided in the inspection device 2 in order to turn on all the switching transistors Q3 at the time of inspection. The gate voltage supply circuit 530 supplies a gate potential which turns on all the switching transistors Q3 during the inspection period based on the signal from the control signal generation section 220. Therefore, in the case of performing the inspection methods shown in FIGS. 4, 9, and 12, all the switching transistors Q3 are turned on before the step 1, and all the switching transistors Q3 are turned off in the end step.

Figure 18:
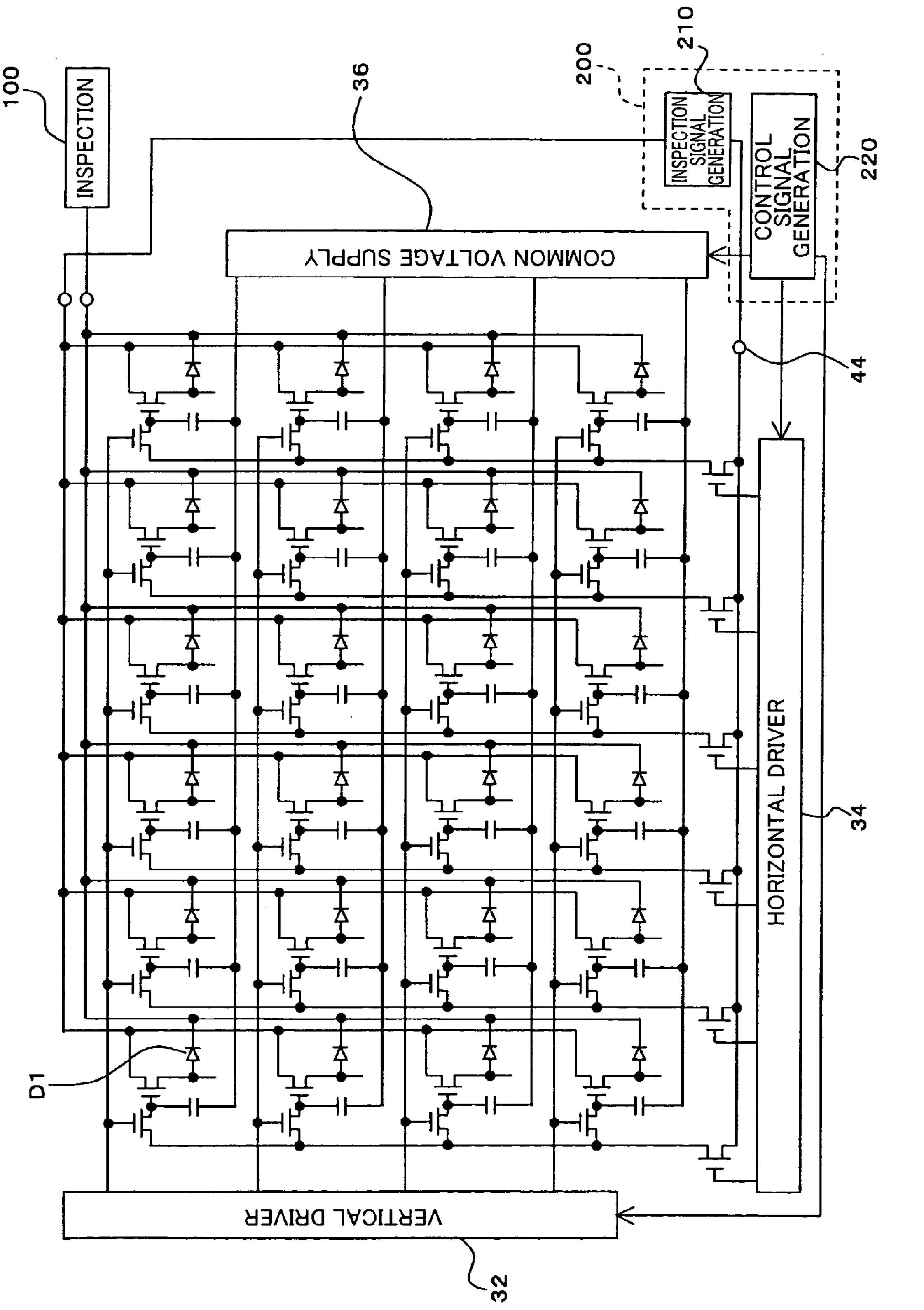
FIG. 18 shows a modification of a reset circuit shown in FIG. 17.

The reset circuit may be formed by a diode D1 as shown in FIG. 18. The diode D1 may be formed by diode-connecting transistors. The diode D1 allows current to pass in the forward direction when the voltage difference between the ends becomes equal to or greater than a constant value. Therefore, in synchronization with the timing at which one operating transistor Q2 is turned on, current can be allowed to flow through only one corresponding diode D1 insofar as all the operating transistors Q2 are normal. When the operating transistor Q2 is abnormal and current flows through the diode D1 even when the operating transistor Q2 is in the off-state at the time of inspection, inspection can be carried out after canceling the leakage current according to the present invention.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention. For example, the above-described embodiment illustrates the matrix type display device. However, the present invention may be applied even when a plurality of pixels are arranged in one direction.

What is claimed is:

1. An inspection method for a display device in which are formed a plurality of pixels arranged at least along one direction and interconnects for causing the pixels to be turned on and off, the inspection method comprising:

generating a first correction current which substantially cancels a first current which flows through an inspection interconnect connected with one of the interconnects when all the pixels are set to an off-state;

inspecting the pixels by sequentially causing the pixels to be turned on; and judging a defect of each of the pixels based on a measured value obtained by correcting a measured current which flows through the inspection interconnect by the first correction current each time the pixels are sequentially turned on.

2. The inspection method for a display device as defined in claim 1, wherein, in the inspection step, an inspection target pixel, which is one of the pixels, is set to an on-state, and the inspection target pixel is set to the off-state before setting another pixel to be subsequently inspected among the pixels to the on-state, and wherein, in the defect judgment step, a defect of each of the pixels is judged based on a difference between the measured value in the on-state and the measured value in the off-state.

3. The inspection method for a display device as defined in claim 1, wherein, in the inspection step, one of the pixels is set to the on-state, and another pixel to be subsequently inspected among the pixels is set to the on-state while maintaining the on-state of the one of the pixels.

4. The inspection method for a display device as defined in claim 3, wherein the pixels are formed along a plurality of lines in the display device, wherein the inspection step further includes:

measuring a second current which flows through the inspection interconnect each time the inspection step is completed for the pixels for one line of the display device; and generating a second correction current, which substantially cancels the second current, instead of the first correction current, and wherein the second correction current is updated each time the inspection step is completed for the pixels for one line of the display device.

5. The inspection method for a display device as defined in claim 3, wherein the inspection step further includes:

measuring a second current which flows through the inspection interconnect each time the inspection step is completed for one of the pixels; and generating a second correction current, which substantially cancels the second current, instead of the first correction current, and wherein the second correction current is updated each time the inspection step is completed for one of the pixels.

6. An inspection device for a display device in which are formed a plurality of pixels arranged at least along one direction and interconnects for causing the pixels to be turned on and off, the inspection device comprising:

an inspection circuit which judges a defect of each of the pixels based on current which flows through an inspection interconnect connected with one of the interconnects; and an inspection driver circuit which drives the display device by supplying a signal necessary for inspection to the display device, wherein the inspection circuit includes:

a correction circuit which generates a first correction current which substantially cancels a first current which flows through the inspection interconnect when all the pixels are set to an off-state based on the first current;

a detection circuit which detects a measured value obtained by correcting a measured current which flows through the inspection interconnect by the first correction current each time the pixels are sequentially set to an on-state; and a defect judgment circuit which judges a defect of each of the pixels based on the measured value.

7. The inspection device for a display device as defined in claim 6, wherein the correction circuit includes:

a current measurement circuit which measures the first current in an upstream region of the inspection interconnect; and a correction current generation circuit which generates the first correction current which substantially cancels the first current and supplies the first connection current to a downstream region of the inspection interconnect.

8. The inspection device for a display device as defined in claim 6, wherein the detection circuit includes a current-voltage conversion circuit which converts current which flows through the inspection interconnect into voltage, and wherein the correct circuit includes a correction current generation circuit which generates the first correction current based on output from the current-voltage conversion circuit and supplies the first correction current to the inspection interconnect.

9. The inspection device for a display device in claim 6, wherein the detection circuit includes a current-voltage conversion circuit which converts current which flows through the inspection interconnect into voltage, and wherein the correction circuit includes:

a voltmeter which measures output from the current-voltage conversion circuit; and a correction current generation circuit which generates the first correction current based on output from the voltmeter and supplies the first correction current to a downstream region of the inspection interconnect.

10. The inspection device for a display device as defined in claim 9, wherein the correction circuit includes a lowpass filter in a preceding stage of the voltmeter.

11. The inspection device for a display device as defined in claim 6, wherein the inspection driver circuit sets an inspection target pixel, which is one of the pixels, to the on-state, and sets the inspection target pixel to the off-state before setting another pixel to be subsequently inspected among the pixels to the on-state, and wherein the defect judgment circuit includes a subtractor which calculates a difference between the measured value in the on-state and the measured value in the off-state for each of the pixels, and judges a defect of the pixels based on output from the subtractor.

12. The inspection device for a display device as defined in claim 6, wherein the inspection driver circuit sets one of the pixels to the on-state and sets another pixel to be subsequently inspected among the pixels to the on-state while maintaining the on-state of one of the pixels.

13. The inspection device for a display device as defined in claim 12, wherein the pixels are formed along a plurality of lines in the display device, and wherein the correction circuit generates a second correction current instead of the first correction current each time inspection is completed for the pixels for one line of the display device, and updates the second correction current each time inspection is completed for the pixels for one line of the display device, the second correction current substantially canceling a second current which flows through the inspection interconnect.

14. The inspection device for a display device as defined in claim 12, wherein the correction circuit generates a second correction current instead of the first correction current each time inspection is completed for one of the pixels, and updates the second correction current each time inspection is completed for one of the pixels, the second correction current substantially canceling a second current which flows through the inspection interconnect.

15. An inspection method for an active matrix substrate, comprising:

providing an active matrix substrate which includes a plurality of pixels, each of the pixels being connected with one of a plurality of signal lines, one of a plurality of scan lines, and one of a plurality of voltage supply lines, each of the pixels including a pixel select transistor connected with one of the signal lines and one of the scan lines, an operating transistor, and a storage capacitor for holding a gate potential of the operating transistor, a gate of the operating transitor being connected with the storage capacitor and the pixel select transistor, one of a source and a drain of the operating transistor being connected with one of the voltage supply lines, and the other of the source and the drain of the operating transistor being connected with an inspection interconnect;

generating a first correction current which substantially cancels a first current which flows through the inspection interconnect when the operating transistor of each of the pixels is set to an off-state;

inspecting the operating transistor by sequentially causing the operating transistor of each of the pixels to be turned on; and judging a defect of the operating transistor of each of the pixels based on a measured value obtained by correcting a measured current which flows through the inspection interconnect by the first correction current each time the operating transistor of each of the pixels is sequentially turned on.

16. The inspection method for an active matrix substrate as defined in claim 15, wherein, in the inspection step, the operating transistor of an inspection target pixel, which is one of the pixels, is set to an on-state, and the operating transistor of the inspection target pixel is set to the off-state before setting the operating transistor of another pixel to be subsequently inspected among the pixels to the on-state, and wherein, in the defect judgment step, a defect of the operating transistor of each of the pixels is judged based on a difference between the measured value in the on-state and the measured value in the off-state.

17. The inspection method for an active matrix substrate as defined in claim 15, wherein, in the inspection step, the operating transistor of one of the pixels is set to the on-state, and the operating transistor of another pixel to be subsequently inspected among the pixels is set to the on-state while maintaining the on-state of the operating transistor of the one of the pixels.

18. The inspection method for an active matrix substrate as defined in claim 17, wherein the pixels are formed along a plurality of lines in the display device, wherein the inspection step further includes:

measuring a second current which flows through the inspection interconnect each time the inspection step is completed for the pixels for one line of the display device; and generating a second correction current, which substantially cancels the second current, instead of the first correction current, and wherein the second correction current is updated each time the inspection step is completed for the pixels for one line of the display device.

19. The inspection method for an active matrix substrate as defined in claim 17, wherein the inspection step further includes:

measuring a second current which flows through the inspection interconnect each time the inspection step is completed for one of the pixels; and generating a second correction current, which substantially cancels the second current, instead of the first correction current, and wherein the second correction current is updated each time the inspection step is completed for the one of the pixels.

20. An inspection device for inspecting an active matrix substrate which includes a plurality of pixels, each of the pixels being connected with one of a plurality of signal lines, one of a plurality of scan lines, and one of a plurality of voltage supply lines, each of the pixels including a pixel select transistor connected with one of the signal lines and one of the scan lines, an operating transistor, and a storage capacitor for holding a gate potential of the operating transistor, a gate of the operating transistor being connected with the storage capacitor and the pixel select transistor, one of a source and a drain of the operating transistor being connected with one of the voltage supply lines, and the other of the source and the drain of the operating transistor being connected with an inspection interconnect, the inspection device comprising:

an inspection circuit which judges a defect of each of the pixels based on current which flows through the inspection interconnect; and an inspection driver circuit which drives the active matrix substrate by supplying a signal necessary for inspection to the active matrix substrate;

wherein the inspection circuit includes:

a correction circuit which generates a first correction current which substantially cancels a first current which flows through the inspection interconnect based on the first current when the operating transistor of each of the pixels is set to an off-state;

a detection circuit which detects a measured value obtained by correcting a measured current which flows through the inspection interconnect by the first correction current each time the operating transistor of each of the pixels is sequentially set to an on-state; and a defect judgment circuit which judges a defect of the operating transistor of each of the pixels based on the measured value.

* * * * *